(12) United States Patent
Kang et al.

(10) Patent No.: US 12,506,081 B2
(45) Date of Patent: Dec. 23, 2025

(54) SEMICONDUCTOR DEVICE

(71) Applicant: SAMSUNG ELECTRONICS CO., LTD., Suwon-si (KR)

(72) Inventors: Byung Ju Kang, Suwon-si (KR); Kwan Young Chun, Suwon-si (KR); Ji Wook Kwon, Suwon-si (KR); Chul Hong Park, Suwon-si (KR); Azmat Raheel, Suwon-si (KR); Suhyeong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 338 days.

(21) Appl. No.: 18/140,356

(22) Filed: Apr. 27, 2023

(65) Prior Publication Data

US 2023/0361036 A1 Nov. 9, 2023

(30) Foreign Application Priority Data

May 3, 2022 (KR) ........................ 10-2022-0054940

(51) Int. Cl.
| | |
|---|---|
| *H01L 23/528* | (2006.01) |
| *H01L 23/48* | (2006.01) |
| *H01L 23/498* | (2006.01) |
| *H01L 23/522* | (2006.01) |
| *H01L 23/538* | (2006.01) |
| *H10D 84/83* | (2025.01) |

(Continued)

(52) U.S. Cl.
CPC ........ *H01L 23/5286* (2013.01); *H01L 23/481* (2013.01)

(58) Field of Classification Search
CPC ............... H01L 23/5286; H01L 23/481; H01L 23/49838; H01L 23/49811; H01L 23/49827; H01L 23/5386; H01L 23/5226; H01L 23/5283; H10D 89/10; H10D 84/834; H10D 84/853
See application file for complete search history.

(56) References Cited

U.S. PATENT DOCUMENTS

| | | |
|---|---|---|
| 6,560,753 B2 | 5/2003 | Barney et al. |
| 10,886,224 B2 | 1/2021 | Gerousis et al. |
| 10,909,298 B1 | 2/2021 | Chan et al. |

(Continued)

OTHER PUBLICATIONS

Office Action issued on Oct. 10, 2023 by European Patent Office in corresponding European Application No. 23 170 824.9.

(Continued)

*Primary Examiner* — Herve-Louis Y Assouman
(74) *Attorney, Agent, or Firm* — Sughrue Mion, PLLC

(57) ABSTRACT

A semiconductor device includes a substrate including a first side and a second side opposite to the first side, a first power rail and a second power rail provided on the first side of the substrate, the first power rail and the second power rail extending in a first direction and being separated in a second direction, a first active region and a second active region provided on the first side of the substrate, the first active region and the second active region being defined by an element separation film between the first power rail and the second power rail and being separated in the second direction, a power delivery network provided on the second side of the substrate, and a first power through via penetrating the element separation film and the substrate, the first power through via connecting the power delivery network and the first power rail.

20 Claims, 24 Drawing Sheets

(51) Int. Cl.
   *H10D 84/85*  (2025.01)
   *H10D 89/10*  (2025.01)

(56) References Cited

U.S. PATENT DOCUMENTS

| | | |
|---|---|---|
| 10,950,546 B1 | 3/2021 | Doornbos |
| 11,177,286 B2 | 11/2021 | Kim et al. |
| 2017/0110405 A1 | 4/2017 | Peng et al. |
| 2021/0118868 A1 | 4/2021 | Sio et al. |
| 2021/0201961 A1 | 7/2021 | Mori et al. |
| 2021/0358848 A1 | 11/2021 | Wu et al. |
| 2022/0068805 A1 | 3/2022 | Lee et al. |
| 2022/0122970 A1 | 4/2022 | Do et al. |

OTHER PUBLICATIONS

Search Report issued on Sep. 27, 2023 by European Patent Office in corresponding European Application No. 23 170 824.9.

SEMICONDUCTOR DEVICE

CROSS-REFERENCE TO RELATED APPLICATION

This application is based on and claims priority to Korean Patent Application No. 10-2022-0054940, filed on May 3, 2022 in the Korean Intellectual Property Office, the disclosure of which is incorporated by reference herein in its entirety.

BACKGROUND

1. Field

Example embodiments of the disclosure relate to a semiconductor device.

2. Description of Related Art

As the electronics industry develops, the demand for characteristics of semiconductor devices gradually increases. For example, there is an increasing demand for high reliability, high speed and/or multi-functionality for the semiconductor devices. In order to satisfy such required characteristics, structures inside the semiconductor device gradually become complicated and highly integrated.

SUMMARY

Provided is semiconductor device having improved product reliability.

Additional aspects will be set forth in part in the description which follows and, in part, will be apparent from the description, or may be learned by practice of the presented embodiments.

According to an aspect of an example embodiment, a semiconductor device may include a substrate including a first side and a second side opposite to the first side, a first power rail and a second power rail provided on the first side of the substrate, the first power rail and the second power rail extending in a first direction and being separated in a second direction, a first active region and a second active region provided on the first side of the substrate, the first active region and the second active region being defined by an element separation film between the first power rail and the second power rail and being separated in the second direction, a power delivery network provided on the second side of the substrate, a first power through via penetrating the element separation film and the substrate, the first power through via connecting the power delivery network and the first power rail, a second power through via penetrating the element separation film and the substrate, the second power through via connecting the power delivery network and the second power rail, a first well contact connecting the first active region and the first power rail, and a second well contact connecting the second active region and the second power rail. The first power rail may include a first extension part extending in the first direction and a first expansion part having a width larger than a width of the first extension part. The second power rail may include a second extension part extending in the first direction, and a second expansion part having a width larger than the width of the second extension part. The first power through via may be connected to the first expansion part, and the second power through via may be connected to the second expansion part.

According to an aspect of an example embodiment, a semiconductor device may include a substrate including a first side and a second side opposite to the first side, a first power rail and a second power rail provided on the first side of the substrate, the first power rail and the second power rail extending in a first direction and being alternately arranged in a second direction, a plurality of well tap cells provided on the first side of the substrate along the second direction, and a power delivery network provided on the second side of the substrate. Each of the plurality of well tap cells may include a first power through via penetrating the substrate, the first power through via connecting the power delivery network and the first power rail, a second power through via penetrating the substrate, the second power through via connecting the power delivery network and the second power rail, a first well contact connecting a first active region and the first power rail, and a second well contact connecting a second active region and the second power rail. The first power through via and the second power through via may be configured in a first arrangement in which the first power through via and the second power through via are provided along a first column or a second arrangement in which the first power through via is provided along the first column and the second power through via is provided along a second column. The first well contact and the second well contact may be provided along a third column between the first column and the second column.

According to an aspect of an example embodiment, a semiconductor device may include a substrate including a first side and a second side opposite to the first side, a first power rail and a second power rail provided on the first side of the substrate, the first power rail and the second power rail extending in a first direction and being alternately arranged in a second direction, a well tap cell provided on the first side of the substrate in a first row, a second row adjacent to the first row, and a third row adjacent to the second row, and a power delivery network provided on the second side of the substrate. Each of the first row, the second row and the third tow may be defined by the first power rail and the second power rail. The well tap cell may include a first power through via penetrating the substrate and extending from the power delivery network to the first power rail, a first well contact connecting the first power rail and a first active region placed in each of the first row, the second row, and the third row, a second well contact connecting the second power rail and a second active region placed in each of the first row, the second row and the third row, and a second power through via penetrating the substrate and extending from the power delivery network to the second power rail.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
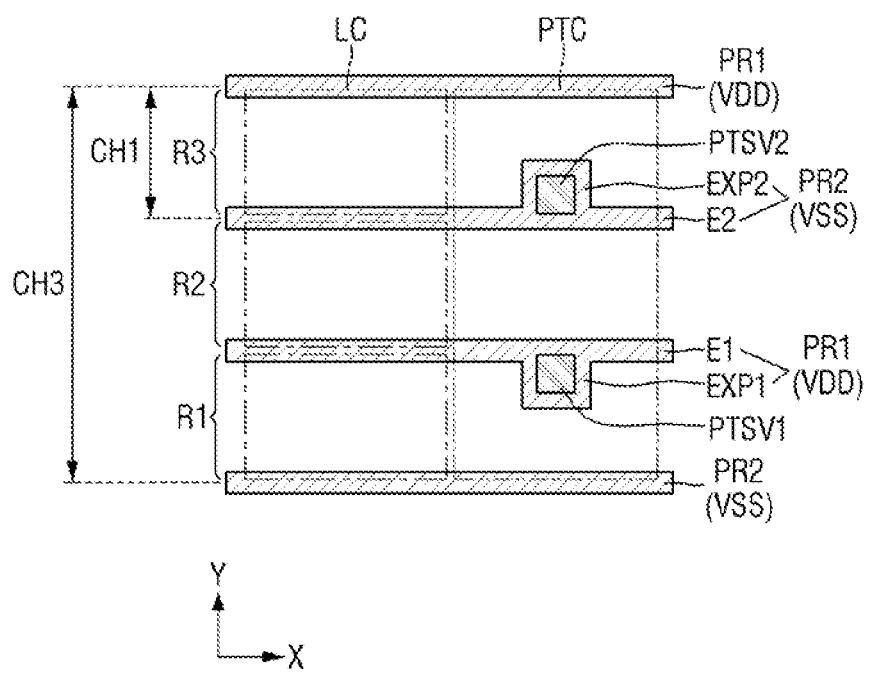
FIG. 1 is a diagram of a semiconductor device according to an example embodiment.

FIG. 1 is a diagram of a semiconductor device according to an example embodiment.

Referring to FIG. 1, the semiconductor device according to example embodiments may include a logic cell LC and a power tap cell PTC.

The logic cell LC may be placed to be placed in a plurality of rows R1, R2, and R3. For example, each logic cell LC may be placed in the first to third rows R1, R2, and R3 which extend in a first direction X and are arranged in a second direction Y. A second row R2 may be adjacent to a first row R1, and a third row R3 may be adjacent to the second row R2. Two rows that are adjacent may indicate that no row is placed between the two rows, although the description is not limited as such. As shown in FIG. 1, no row is placed between the second row R2 and the first row R1, and no row is placed between the third row R3 and the second row R2. The second direction Y may be perpendicular to the first direction X.

The first to third rows R1, R2, and R3 may have a first cell height CH1 defined in the second direction Y. The logic cell LC may be placed in any one row among the first to third rows R1, R2, and R3, and may have a first cell height CH1. That is, the logic cell LC may be a single height cell.

A first power rail PR1 and a second power rail PR2 may extend in the first direction X and be spaced apart from each other in the second direction Y. The first power rail PR1 and the second power rail PR2 may be arranged alternately in the second direction Y. The first power rail PR1 and the second power rail PR2 may extend along a boundary between the first to third rows R1, R2, and R3. For example, the first power rail PR1 may extend along the boundary between the first row R1 and the second row R2, and the second power rail PR2 may extend along the boundary between the second row R2 and the second row R3. The first power rail PR1 may provide a first voltage VDD, and the second power rail PR2 may provide a second voltage VSS different from the first voltage VDD. For example, the first voltage VDD may be a positive (+) voltage, and the second voltage VSS may be a ground (GND) voltage or a negative (−) voltage.

The logic cell LC may be defined between the first power rail PR1 and the second power rail PR2. The first cell height CH1 may be substantially equal to a distance between the first power rail PR1 and the second power rail PR2.

The logic cell LC may include a first active region of a first conductive type and a second active region of a second conductive type which are arranged along the second direction Y. For example, the first active region may be a p-type metal-oxide-semiconductor field effect transistor (PMOSFET) region, and the second active region may be an n-type MOSFET (NMOSFET) region. Hereinafter, the first active region may be referred to as a PMOSFET region, and the second active region may be referred to as an NMOSFET region, however, in example embodiments, such a configuration may be reversed. The logic cell LC may include a gate electrode arranged along the first direction X and extending in the second direction Y. The gate electrodes may be arranged along the first direction X at a first pitch.

The logic cell LC may refer to any one of various cells for implementing a logic circuit. For example, the logic cell LC may represent at least one of various logic elements such as an AND gate, a NAND gate, an OR gate, a NOR gate, an XOR gate, an inverter and the like. The logic cell LC may include transistors for forming each logic element, and wirings for connecting the transistors to each other. The logic cell LC may be referred to as a standard cell.

The power tap cell PTC may be continuously placed in the first to third rows R1, R2, and R3. The power tap cell PTC may have a third cell height CH3 that is three times the first cell height CH1. That is, the power tap cell PTC may be a triple height cell. The first power rail PR1 and the second power rail PR2 may extend in the first direction X on the power tap cell PTC.

The power tap cell PTC may include two power through vias PTSV1 and PTSV2. A first power through via PTSV1 may connect the first power rail PR1 and a power delivery network to be described below, and a second power through via PTSV2 may connect the second power rail PR2 and the power delivery network. The first power through via PTSV1 may be connected to a first expansion part EXP1, and the second power through via PTSV2 may be connected to a second expansion part EXP2. Therefore, the power tap cell PTC may provide a first voltage VDD from the power delivery network to the first power rail PR1, and may provide a second voltage VSS from the power delivery network to the second power rail PR2. At least a part of the first expansion part EXP1 may overlap the second expansion part EXP2 in the second direction Y. The first and second extension parts E1 and E2 and the first and second expansion parts EXP1 and EXP2 will be described in detail with reference to FIGS. 2 to 4.

Unlike the logic cell LC, the power tap cell PTC does not include a logic element. The power tap cell PTC may be a kind of dummy cell that provides the first and second power rails PR1 and PR2 with the first and second voltages VDD and VSS but does not perform a circuit function.

The placement of the logic cell LC and the power tap cell PTC shown in FIG. 1 is merely an example, and the placement of the logic cell LC and the power tap cell PTC may be changed in various ways.

Figure 2:
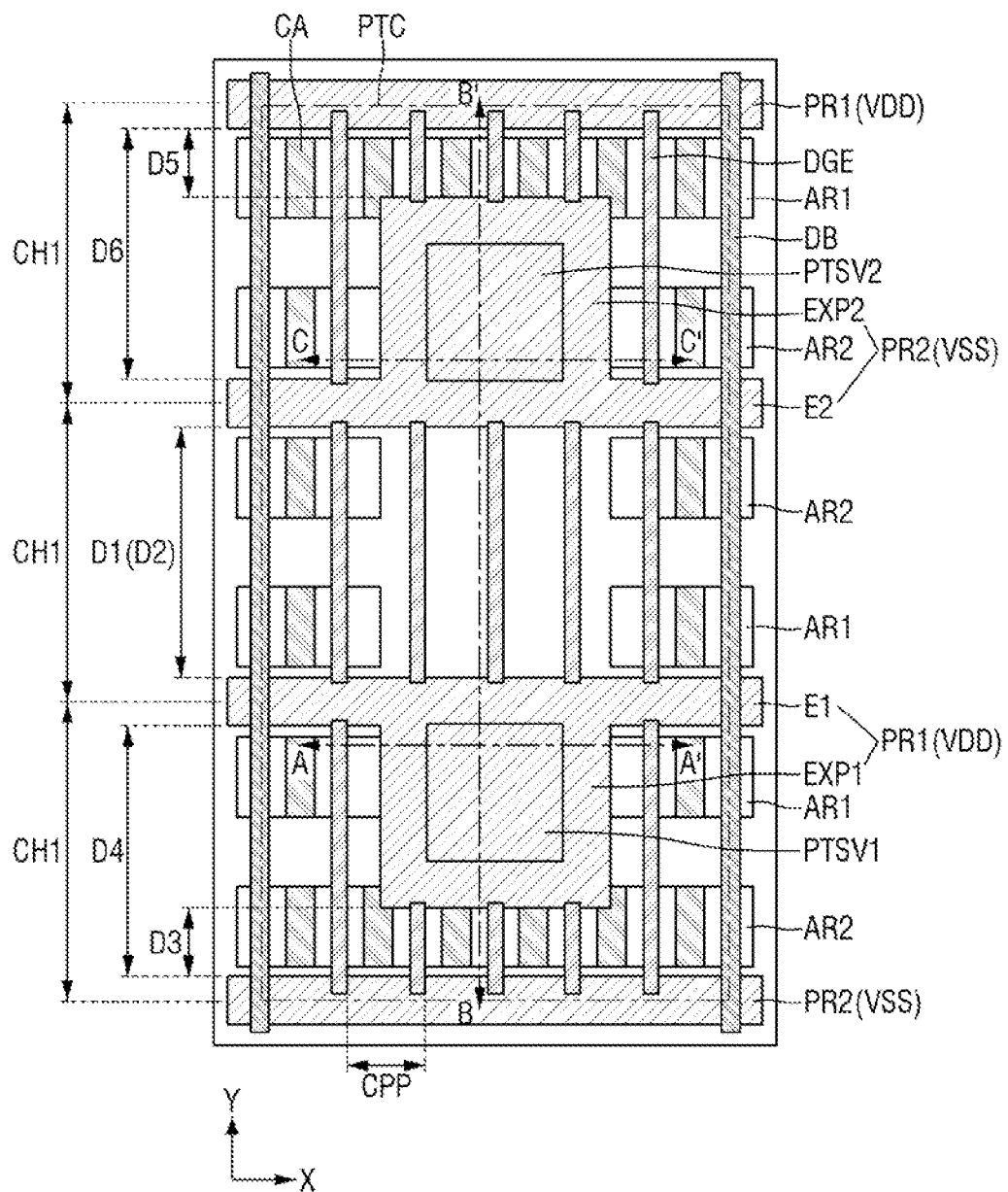
FIG. 2 is a diagram of a power tap cell of FIG. 1 according to an example embodiment.
Figure 3:
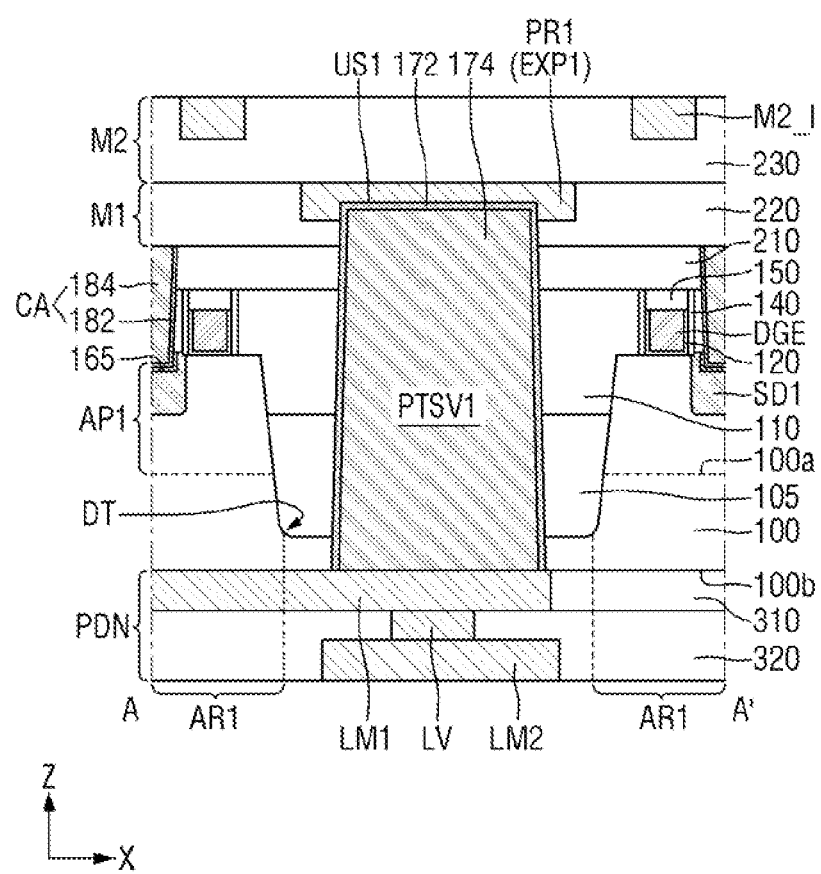
FIG. 3 is a cross-sectional view taken along a line A-A' of FIG. 2 according to an example embodiment.
Figure 4:
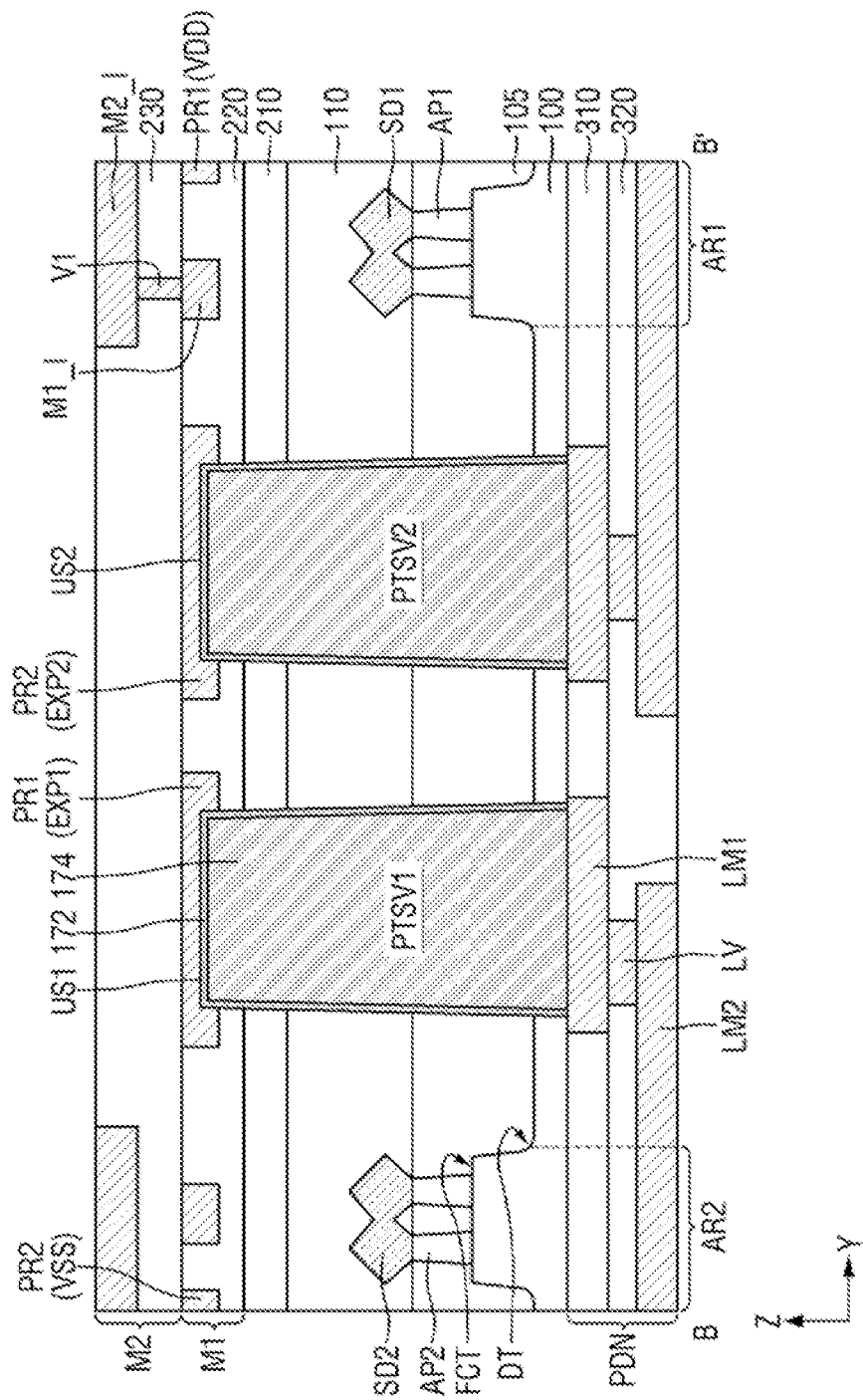
FIG. 4 is a cross-sectional view taken along a line B-B' of FIG. 2 according to an example embodiment.

FIG. 2 is a diagram of a power tap cell of FIG. 1 according to an example embodiment. FIG. 3 is a cross-sectional view taken along a line A-A' of FIG. 2 according to an example embodiment. FIG. 4 is a cross-sectional view taken along a line B-B' of FIG. 2 according to an example embodiment.

Referring to FIGS. 2 to 4, the power tap cell PTC placed on the substrate 100 may include first and second active regions AR1 and AR2, first and second active patterns AP1 and AP2, a dummy gate electrode DGE, a source/drain contact CA, a first metal layer M1, a second metal layer M2, a and power delivery network PDN.

The substrate 100 may be bulk silicon or silicon-on-insulator (SOI). In contrast, the substrate 100 may be a silicon substrate or may include, but not limited to, other materials, for example, silicon germanium, silicon germanium on insulator (SGOI), indium antimonide, lead tellurium compounds, indium arsenic, indium phosphate, gallium arsenide, or gallium antimonide.

The substrate 100 may include a first side 100a and a second side 100b that are opposite to each other. The first side 100a may be referred to as an upper side of the substrate 100, and the second side 100b may be referred to as a lower side of the substrate 100. The logic cell (LC of FIG. 1) and the power tap cell PTC may be implemented on the first side 100a of the substrate 100.

The substrate 100 may include a first active region AR1 and a second active region AR2. For example, the first active region AR1 may be a PMOSFET region, and the second active region AR2 may be an NMOSFET region. The first active region AR1 may include the same structure as that of the first active region of the logic cell LC of FIG. 1, but does not form a circuit. The second active region AR2 includes the same structure as that of the second active region of the logic cell LC of FIG. 1, but does not form a circuit.

The first active region AR1 and the second active region AR2 may be defined by a substrate trench DT. The substrate trench DT may extend in the first direction X to separate the first active region AR1 and the second active region AR2. The first active region AR1 and the second active region AR2 may extend in the first direction X. The first active region AR1 and the second active region AR2 may be spaced apart from each other in the second direction Y.

The first and second active patterns AP1 and AP2 may be formed on the substrate 100. For example, the first active pattern AP1 may be formed on the first active region AR1, and the second active pattern AP2 may be formed on the second active region AR2. The first and second active patterns AP1 and AP2 may extend in the first direction X. The first and second active patterns AP1 and AP2 may be spaced apart from each other in the second direction Y which intersects the first direction X.

The first and second active patterns AP1 and AP2 may be defined by a fin cut trench FCT. The fin cut trench FCT may define side walls of the first and second active patterns AP1 and AP2. The substrate trench DT may be a trench that is deeper than the fin cut trench FCT. In example embodiments, the first and second active patterns AP1 and AP2 may each include a fin type pattern that protrudes from the first side 100a of the substrate 100. From a planar point of view, each of the first and second active patterns AP1 and AP2 may have the form of a bar extending in the second direction Y.

The first and second active patterns AP1 and AP2 may be a part of the substrate 100, or may include an epitaxial layer that grows from the substrate 100. The first and second active patterns AP1 and AP2 may include, for example, silicon or germanium, which are elemental semiconductor materials. Further, the first and second active patterns AP1 and AP2 may include a compound semiconductor, and may include, for example, a group IV-IV compound semiconductor or a group III-V compound semiconductor. The group IV-IV compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element. As an example, the first active pattern AP1 may include the same material as the second active pattern AP2. As another example, the first active pattern AP1 may include a different material from the second active pattern AP2.

An element separation film 105 may be formed on the first side 100a of the substrate 100. The element separation film 105 may surround at least a part of the side wall of the first active pattern AP1 and at least a part of the side wall of the second active pattern AP2. The element separation film 105 may fill at least a part of the substrate trench DT and the fin cut trench FCT. The first and second active patterns AP1 and AP2 may protrude above the upper surface of the element separation film 105.

The element separation film 105 may include, for example, an oxide film, a nitride film, an oxynitride film or a combination film thereof.

A dummy gate electrode DGE may be placed in the first and second active regions AR1 and AR2. The dummy gate electrodes DGE may extend in the second direction Y, and may be spaced apart from each other in the first direction X. The dummy gate electrodes DGE may be placed within 1 contacted poly pitct (CPP) interval along the first direction X. The dummy gate electrode DGE may intersect the first and second active patterns AP1 and AP2.

A distance CPP between the dummy gate electrodes DGE may be substantially equal to the pitch between the gate electrodes of the logic cell LC of FIG. 1. The dummy gate electrode DGE includes the same structure as the gate electrode placed on the first and second active regions of the logic cell LC of FIG. 1, but does not form a circuit.

The dummy gate electrode DGE may include, for example, but not limited to, at least one of Ti, Ta, W, Al, Co, and combinations thereof. The dummy gate electrode DGE may include, for example, silicon, silicon germanium or the like other than metal.

Although the dummy gate electrode DGE is shown as a single film in the drawing, the example embodiments of the present disclosure is not limited thereto. The dummy gate electrode DGE may be formed by stacking a plurality of conductive materials. For example, the dummy gate electrode DGE may include a work function adjusting film that adjusts the work function, and a filling conductive film that fills a space formed by the work function adjusting film. The work function adjusting film may include, for example, at least one of TiN, TaN, TiC, TaC, TiAlC, and combinations thereof. The filling conductive film may include, for example, W or Al. Such a dummy gate electrode DGE may be formed, for example, but not limited to, through a replacement process.

A gate dielectric film 120 may be interposed between the first and second active patterns AP1 and AP2 and the dummy gate electrode DGE. For example, the gate dielectric film 120 may extend along the side walls and bottom surface of the dummy gate electrode DGE. However, the example embodiments of the present disclosure is not limited thereto, and the gate dielectric film 120 extends along the bottom surface of the dummy gate electrode DGE, but may not extend along the side wall of the dummy gate electrode DGE.

The gate dielectric film 120 may be interposed between the element separation film 105 and the dummy gate electrode DGE. The gate dielectric film 120 may be formed along profiles of the first and second active patterns AP1 and AP2 protruding above the element separation film 105 and the upper surface of the element separation film 105.

The gate dielectric film 120 may include, for example, at least one of silicon oxide, silicon oxynitride, silicon nitride, and a high dielectric constant (high-k) material having a higher dielectric constant than silicon oxide. The high dielectric constant material may include, for example, but not limited to, hafnium oxide.

A gate spacer 140 may be formed on the substrate 100 and the element separation film 105. The gate spacer 140 may extend along both side walls of the dummy gate electrode DGE. The gate spacer 140 may be placed on long side walls of the dummy gate electrode DGE. For example, the gate spacer 140 may extend in the second direction Y.

The gate spacer 140 may include, for example, but not limited to, at least one of silicon oxide, silicon nitride, silicon oxynitride, and combinations thereof.

The gate capping pattern 150 may extend along the upper surface of the dummy gate electrode DGE. For example, the gate capping pattern 150 may extend in the second direction Y to cover the upper surface of the dummy gate electrode DGE. However, the example embodiments of the present disclosure is not limited thereto, and the gate capping pattern 150 may be further placed on the upper surface of the gate spacer 140.

The gate capping pattern 150 may include, for example, but not limited to, at least one of silicon oxide, silicon nitride, silicon oxynitride, and combinations thereof.

Cell separation patterns DB extending in the second direction Y and adjacent to each other in the first direction X may be placed. The cell separation pattern DB may extend parallel to the dummy gate electrode DGE. A distance between the cell separation pattern DB and the dummy gate electrode DGE adjacent to the cell separation pattern DB in the first direction X may be substantially equal to CPP. That is, for example, the width of the power tap cell PTC may be six times the CPP.

The power tap cell PTC may be defined by the cell separation pattern DB. The power tap cell PTC may be defined between the cell separation patterns DB adjacent to each other in the first direction X. The logic cell LC of FIG. 1 may also be defined between the cell separation patterns DB adjacent to each other in the first direction X. The power tap cell PTC and the logic cell LC may be electrically separated by the cell separation pattern DB.

A first source/drain region SD1 may be placed on the first active pattern AP1. The first source/drain region SD1 may be formed inside the first active pattern AP1 on both sides of the dummy gate electrode DGE. The first source/drain region SD1 may be placed between the dummy gate electrodes DGE adjacent to each other. The first source/drain region SD1 may be spaced apart from the dummy gate electrode DGE by the gate spacer 140. The first source/drain region SD1 may include an epitaxial layer formed inside the first active pattern AP1. In example embodiments, the first active pattern AP1 may share the first source/drain region SD1. For example, the first source/drain region SD1 may be a merged epitaxial layer.

A second source/drain region SD2 may be placed on the second active pattern AP2. The second source/drain region SD2 may be formed inside the second active pattern AP2 on both sides of the dummy gate electrode DGE. The second source/drain region SD2 may be placed between the dummy gate electrodes DGE adjacent to each other. The second source/drain region SD2 may be spaced apart from the dummy gate electrode DGE by the gate spacer 140. The second source/drain region SD2 may include an epitaxial layer formed inside the second active pattern AP2. In example embodiments, the second active pattern AP2 may share the second source/drain region SD2. For example, the second source/drain region SD2 may be a merged epitaxial layer.

For example, the first source/drain region SD1 may be a p-type impurity region, and the second source/drain region SD2 may be an n-type impurity region.

A first upper interlayer insulating film 110, a second upper interlayer insulating film 210, a third upper interlayer insulating film 220, and a fourth upper interlayer insulating film 230 may be placed on the first side 100a of the substrate 100. The first to fourth upper interlayer insulating films 110, 210, 220, and 230 may be sequentially stacked on the first side 100a of the substrate 100. The first to fourth upper interlayer insulating films 110, 210, 220, and 230 may include, for example, but not limited to, at least one of silicon oxide, silicon oxynitride, and low dielectric constant (low-k) materials having a dielectric constant lower than that of silicon oxide.

The first upper interlayer insulating film 110 and the second upper interlayer insulating film 210 may be formed to cover the element separation film 105, the first source/drain region SD1, the second source/drain region SD2, the gate spacer 140, and the gate capping pattern 150. For example, the first upper interlayer insulating film 110 is formed on the element separation film 105 and may cover the side wall of the gate spacer 140. The second upper interlayer insulating film 210 is formed on the first upper interlayer insulating film 110 and may cover the upper surface of the gate capping pattern 150.

The source/drain contact CA may be placed on at least one side of the dummy gate electrode DGE. The source/drain contact CA may be placed between the dummy gate electrode DGE and the cell separation pattern DB. The source/drain contact CA penetrates the first and second upper interlayer insulating films 110 and 210, and may be electrically connected to the first and second source/drain regions SD1 and SD2. At least one of the source/drain contacts AC may be a dummy contact. At least one of the source/drain contacts AC may not be connected to the first metal layer M1. The source/drain contact CA of the logic cell LC of FIG. 1 may be electrically connected to the first metal layer M1 through the first via inside the first metal layer M1. The gate contact electrically connected to the gate electrode of the logic cell LC of FIG. 1 may be electrically connected to the first metal layer M1 through the first via inside the first metal layer M1.

The source/drain contact CA may include a source/drain barrier film 182 and a source/drain filling film 184. The source/drain barrier film 182 may be interposed between the first and second upper interlayer insulating films 110 and 210 and the source/drain filling film 184. For example, the source/drain barrier film 182 may include, but not limited to, at least one of titanium (Ti), tantalum (Ta), tungsten (W), nickel (Ni), cobalt (Co), platinum (Pt), alloys and nitrides thereof. For example, the source/drain filling film 184 may include, but not limited to, at least one of aluminum (Al), copper (Cu), tungsten (W), molybdenum (Mo), cobalt (Co), and alloys thereof.

A silicide film 165 may be formed between the source/drain contact CA and the first and second source/drain regions SD1 and SD2.

The first metal layer M1 may be placed inside the third upper interlayer insulating film 220. The first metal layer M1 may include a first power rail PR1, a second power rail PR2, and a first wiring M1_I. The first power rail PR1 and the second power rail PR2 may extend in the first direction X. The first wiring M1_I may be placed between the first power rail PR1 and the second power rail PR2. The first wiring M1_I may extend in the first direction X.

For example, the first wiring M1_I, the first and second power rails PR1 and PR2, and the first and second contact vias VA1 and VA2 of the first metal layer M1 may be formed through a single damascene process, but the formation process is not limited thereto. The first wiring M1_I, the first and second power rails PR1 and PR2 and the first via of the first metal layer M1 may, of course, be formed by a dual damascene process or another wiring process.

The first power rail PR1 may include a first extension part E1 extending in the first direction X, and a first expansion part EXP1 having a width greater than the width of the first extension part E1. The width of the first expansion part EXP1 in the second direction Y may be greater than the width of the first extension part E1 in the second direction Y.

The second power rail PR2 may include a second extension part E2 extending in the first direction X, and a second expansion part EXP2 having a width greater than the width of the second extension part E2. The width of the second expansion part EXP2 in the second direction Y may be greater than the width of the second extension part E2 in the second direction Y.

A first distance D1 in the second direction Y between the first expansion part EXP1 and the second expansion part EXP2 may be substantially the same as a second distance D2 in the second direction Y between the first extension part E1 and the second extension part E2.

In other words, a third distance D3 in the second direction Y between the second power rail PR2, which is adjacent to the first expansion part EXP1 and defines the boundary of the power tap cell PTC, and the first expansion part EXP1 may be less than a fourth distance D4 in the second direction Y between the second power rail PR2, which is adjacent to the first expansion part EXP1 and defines the boundary of the power tap cell PTC, and the first extension part E1. A fifth distance D5 in the second direction Y between the first power rail PR1, which is adjacent to the second expansion part EXP2 and defines the boundary of the power tap cell PTC, and the second expansion part EXP2 may be less than a sixth distance D6 in the second direction Y between the first power rail PR1, which is adjacent to the second expansion part EXP2 and defines the boundary of the power tap cell PTC, and the second extension part E2. The first distance D1 may be less than the third distance D3 and the fifth distance D5.

That is, the first expansion part EXP1 may protrude from a first side wall of the first extension part E1 in the second direction Y, and the second expansion part EXP2 may protrude from a first side wall of the second extension part E2 in the second direction Y. The second side wall of the first extension part E1 in the second direction Y may be substantially coplanar with the first expansion part EXP1, and the second side wall of the second extension part E2 may be substantially coplanar with the second expansion part EXP2. The second side wall of the first extension part E1 in the second direction Y and the second side wall of the second extension part E2 in the second direction Y may be opposite to each other.

The second metal layer M2 may be placed inside the fourth upper interlayer insulating film 230. The second metal layer M2 may include a second wiring M2_I and a first via V1. The second wiring M2_I may extend in the second direction Y. The second wiring M2_I may be electrically connected to the first wiring M1_I through the first via V1.

For example, the second wiring M2_I and the first via V1 of the second metal layer M2 may be formed, but not limited to, by a dual damascene process. The second wiring M2_I and the first via V1 of the second metal layer M2 may be formed by a single damascene process or another wiring process.

The first wiring M1_I, the first and second power rails PR1 and PR2 and the first via of the first metal layer M1, and the second wiring M2_I and the first via V1 of the second metal layer M2 may include, for example, but not limited to, at least one of aluminum (Al), copper (Cu), tungsten (W), molybdenum (Mo), cobalt (Co) and alloys thereof. Further, the first wiring M1_I, the first and second power rails PR1 and PR2 and the first via of the first metal layer M1, and the second wiring M2_I and the first via V1 of the second metal layer M2 may further include, for example, a barrier film. The barrier film may include, for example, but not limited to, at least one of titanium (Ti), tantalum (Ta), tungsten (W), nickel (Ni), cobalt (Co), platinum (Pt), alloys, and nitrides thereof.

A power delivery network PDN may be placed on the second side 100b of the substrate 100. The power delivery network PDN may form a wiring network for providing the first and second voltage VDD and VSS to the first and second power rails PR1 and PR2.

Specifically, the power delivery network PDN may include a first lower interlayer insulating film 310, a second lower interlayer insulating film 320, a first lower wiring LM1, a lower via LV, and a second lower wiring LM2. The first lower interlayer insulating film 310 and the second lower interlayer insulating film 320 may be sequentially stacked on the second side 100b of the substrate 100. The first lower wiring LM1 may be placed in the first lower interlayer insulating film 310, and the lower via LV and the second lower wiring LM2 may be placed in the second lower interlayer insulating film 320. The lower via LV may connect the first lower wiring LM1 and the second lower wiring LM2.

The numbers, placements, and the like of the first wiring M1_I, the second wiring M2_I, the first via V1, the first lower wiring LM1 and the second lower wiring LM2 are merely for convenience of explanation, and are not limited thereto. Further, at least one metal layer may be further placed on the second metal layer M2, and at least one lower wiring may be further placed on the second lower wiring LM2.

The power tap cell PTC may include a first power through via PTSV1 and a second power through via PTSV2. The widths of the first and second power through vias PTSV1 and PTSV2 may be greater than the widths of the first via, the first via V1 and the lower via LV.

The first power through via PTSV1 may be placed between the first active regions AR1 adjacent to each other in the first direction X. The first power through via PTSV1 may overlap the first expansion part EXP1 in a third direction Z. The first power through via PTSV1 may penetrate the substrate 100 and extend from the power delivery network PDN to the first expansion part EXP1 of the first power rail PR1. The first power through via PTSV1 may penetrate the substrate 100, the element separation film 105 that fills the substrate trench DT, and the first to third upper interlayer insulating films 110, 210, and 220. The first power through via PTSV1 may electrically connect the first lower wiring LM1 and the first expansion part EXP1 of the first power rail PR1. As a result, the power tap cell PTC may apply the first voltage VDD from the power delivery network PDN to the first power rail PR1.

In example embodiments, the width of the first power through via PTSV1 may decrease from the first lower wiring LM1 toward the first power rail PR1. This may be due to the characteristics of the etching process for forming the first power through via PTSV1. For example, the first power through via PTSV1 may be formed by an etching process performed on the second side 100b of the substrate 100.

In example embodiments, the first power through via PTSV1 may penetrate a part of the first power rail PR1. An upper surface US1 of the first power through via PTSV1 in the third direction Z may be placed inside the first expansion part EXP1 of the first power rail PR1. For example, the first power rail PR1 may include a filling film and a barrier film that wraps the filling film, and the upper surface US1 of the first power through via PTSV1 may come into contact with the filling film.

The second power through via PTSV2 may be placed between second active regions AR2 adjacent to each other in the first direction X. The second power through via PTSV2 may overlap the second expansion part EXP2 in the third direction Z. The second power through via PTSV2 may penetrate the substrate 100 and extend from the power delivery network PDN to the second expansion part EXP2 of the second power rail PR2. The second power through via PTSV2 may penetrate the substrate 100, the element separation film 105 that fills the substrate trench DT, and the first to third upper interlayer insulating films 110, 210, and 220. The second power through via PTSV2 may electrically connect the first lower wiring LM1 and the second expansion part EXP2 of the second power rail PR2. As a result, the power tap cell PTC may apply the second voltage VSS from the power delivery network PDN to the second power rail PR2.

In example embodiments, the width of the second power through via PTSV2 may decrease from the first lower wiring LM1 toward the second power rail PR2. This may be due to the characteristics of the etching process for forming the second power through via PTSV2. For example, the second power through via PTSV2 may be formed by an etching process performed on the second side 100b of the substrate 100.

In example embodiments, the second power through via PTSV2 may penetrate a part of the second power rail PR2. An upper surface US2 of the second power through via PTSV2 in the third direction Z may be placed inside the second expansion part EXP2 of the second power rail PR2. For example, the second power rail PR2 may include a filling film and a barrier film that wraps the filling film, and the upper surface US2 of the second power through via PTSV2 may come into contact with the filling film.

The first and second power through vias PTSV1 and PTSV2 may include a barrier film 172 and a filling film 174. The barrier film 172 may wrap the filling film 174. For example, the barrier film 172 may include, but not limited to, at least of titanium (Ti), tantalum (Ta), tungsten (W), nickel (Ni), cobalt (Co), platinum (Pt), alloys, and nitrides thereof. For example, the filling film 174 may include, but not limited to, at least one of aluminum (Al), copper (Cu), tungsten (W), molybdenum (Mo), cobalt (Co) and alloys thereof.

In the semiconductor device according to example embodiments, the first power rail PR1 may include a first expansion part EXP1, the second power rail PR2 may include a second expansion part EXP2, and each of the first and second expansion parts EXP1 and EXP2 may have a width greater than the first and second power through vias PTSV1 and PTSV2. Widths of each of the first and second expansion parts EXP1 and EXP2 in the first and second directions X and Y may be greater than the widths of each of the first and second power through vias PTSV1 and PTSV2 in the first and second directions X and Y. Therefore, the first and second power through vias PTSV1 and PTSV2 having a relatively large size may be more stably electrically connected to the first and second power rails PR1 and PR2.

Further, referring to FIG. 1, when the power tap cell PTC is a double height cell having a cell height that is twice the first cell height CH1, a single power rail may be placed on one power tap cell PTC. For example, when the power tap cell PTC is continuously placed in the first and second rows R1 and R2, the single first power rail PR1 and the single first power through via PTSV1 may be placed. That is, the single power tap cell PTC may include the single first power through via PTSV1 that provides a first voltage VDD to the first power rail PR1. Therefore, a power tap cell which is a double height cell for providing the first voltage VDD to the first power rail PR1, and a power tap cell which is a double height cell for providing the second voltage VSS to the second power rail PR2 may be required. That is, the power tap cells which are two double height cells may be required to provide the first and second voltages VDD and VSS to the first power rail PR1 and the second power rail PR2. For example, the power tap cell PTC may be placed in a region which is four times as large as that of the first logic cell LC1.

However, in the semiconductor device according to example embodiments, the power tap cell PTC may be a triple height cell having a height that is three times as large as that of the first cell height CH1, and may include a first power through via PTSV1 that provides the first power rail PR1 with the first voltage VDD, and a second power through via PTSV2 that provides the second power rail PR2 with the second voltage VSS. For example, the power tap cell PTC may be placed in a region that is three times as large as that of the first logic cell LC1. Therefore, an area occupied by the power tap cell PTC in the semiconductor device may decrease.

Figure 7:
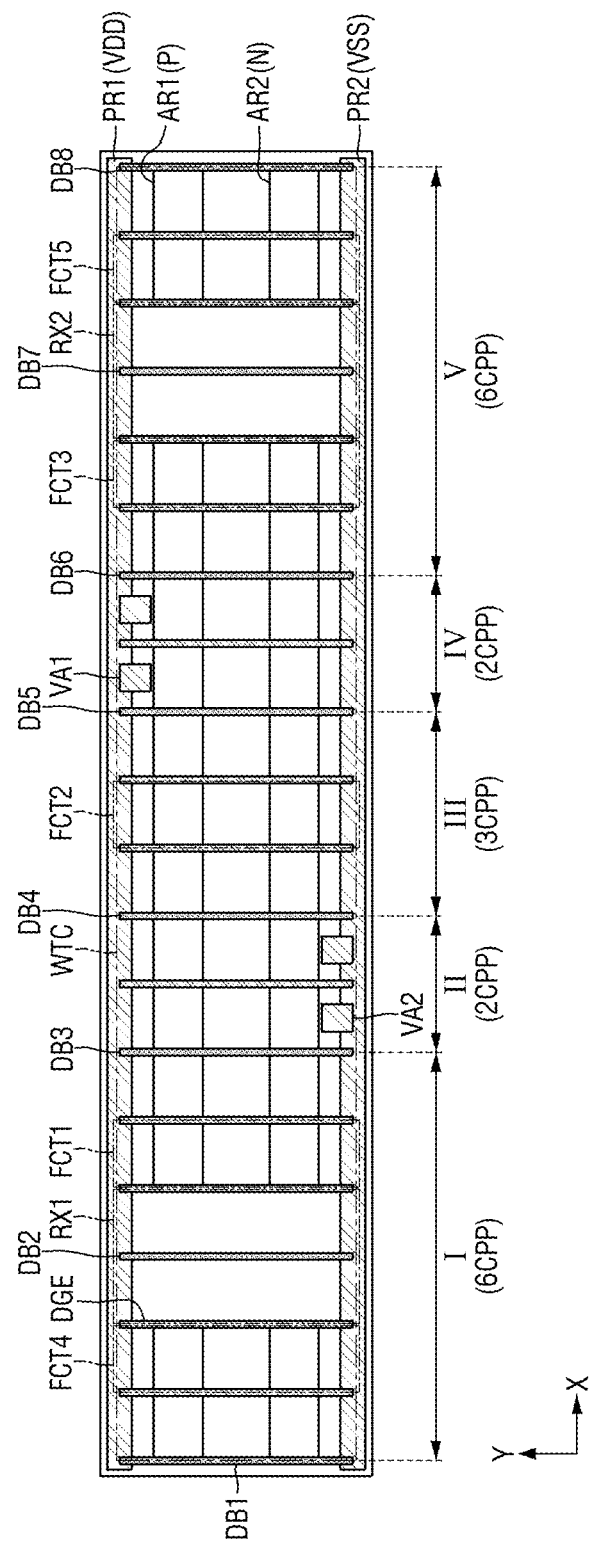
Figure 8:
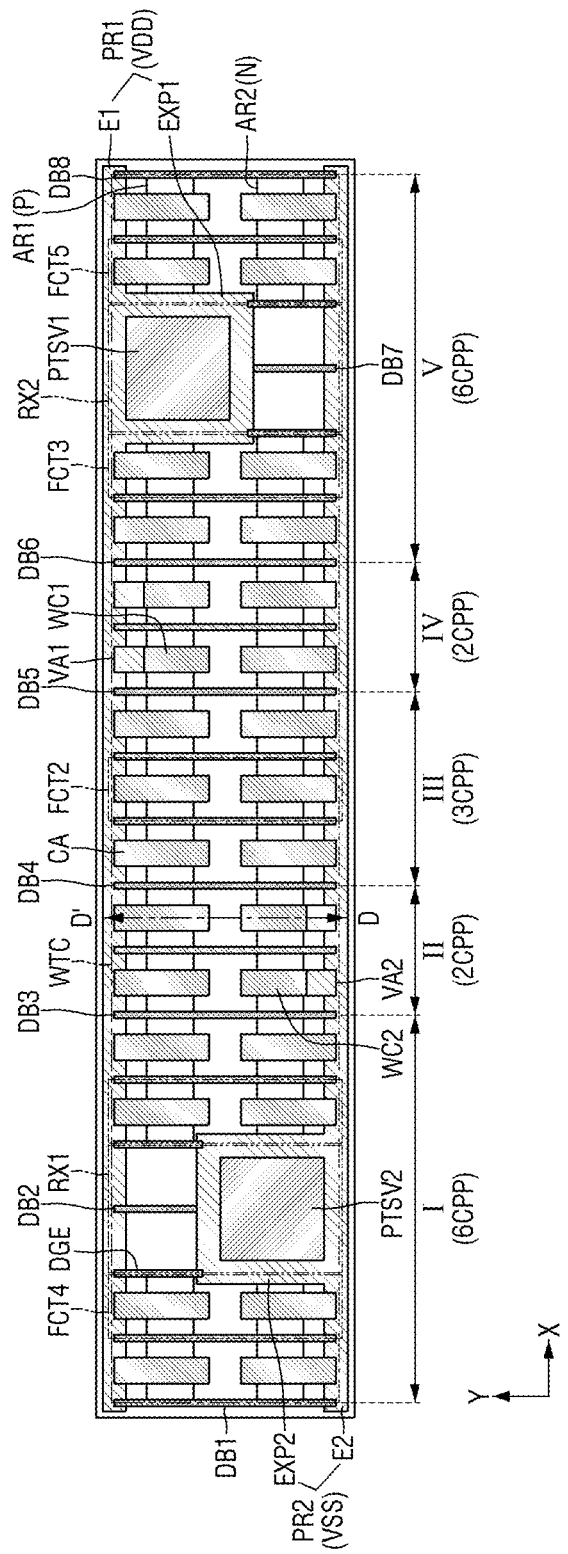
Figure 9:
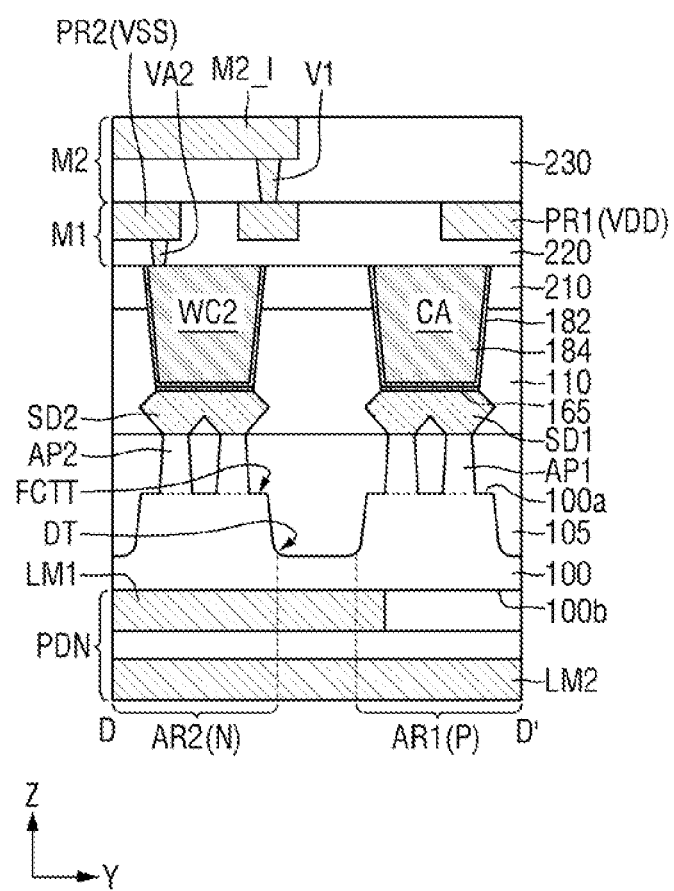

FIGS. 5, 6, 7, 8, 9, 10, 11, 12, 13, 14, 15 and 16 are diagrams of a semiconductor device according to an example embodiment. For reference, FIG. 9 is a cross-sectional view taken along the line D-D' of FIG. 8.

Figure 5:
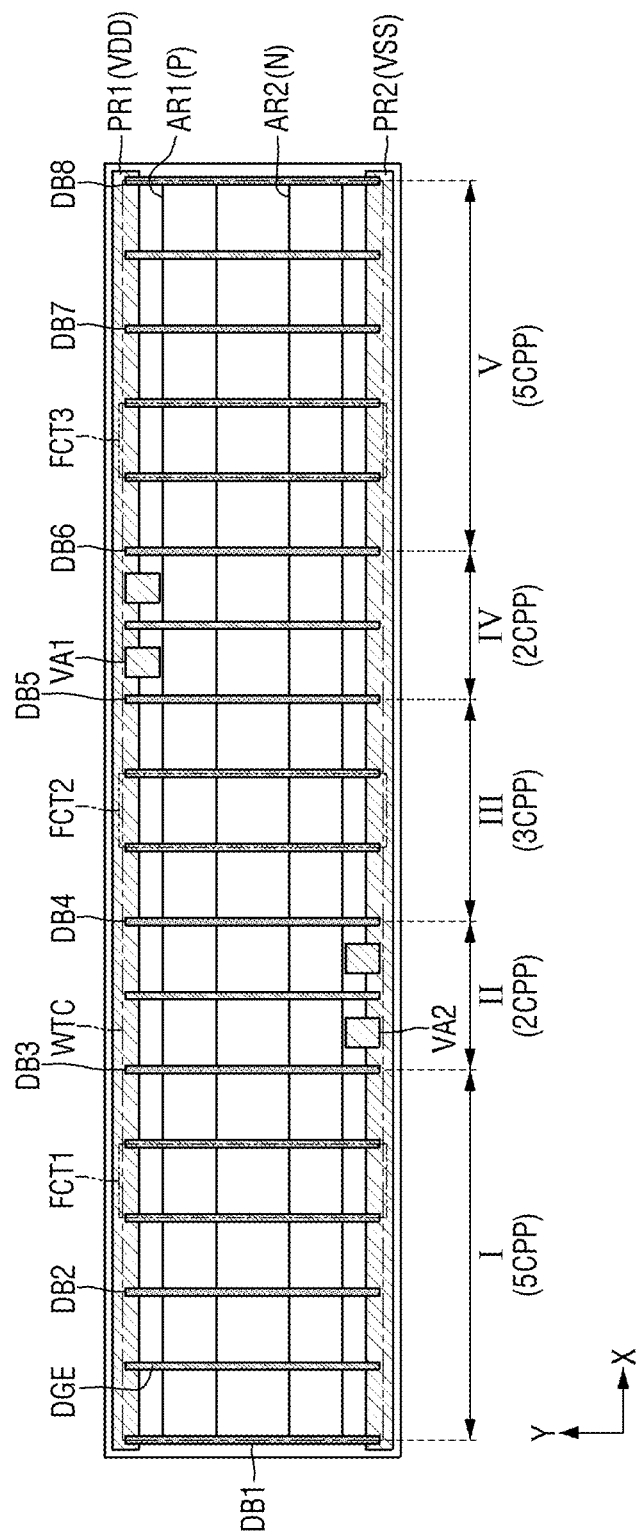
FIGS. 5, 6, 7, 8, 9, 10, 11, 12, 13, 14, 15 and 16 are diagrams of a semiconductor device according to an example embodiment.

Referring to FIG. 5, the well tap cell WTC may be defined between the first power rail PR1 and the second power rail PR2. The well tap cell WTC may be a single height cell.

The well tap cell WTC may be defined by the first and eighth cell separation patterns DB1 and DB8. The well tap cell WTC may be electrically separated by the first and eighth cell separation patterns DB1 and DB8. The well tap cell WTC may have a width of, for example, 17CPP. A distance between the cell separation pattern DB and the dummy gate electrode DGE adjacent to each other, and a distance between the dummy gate electrodes DGE adjacent to each other may be 1CPP.

The well tap cell WTC may include first to fifth regions I, II, III, IV, and V. The first region I may have a width of 6CPP. The first region I may be defined by the first and third cell separation patterns DB1 and DB3. A first fin cut trench FCT1 may cut an active pattern (e.g., AP1, AP2 of FIGS. 3 and 4) between the two dummy gate electrodes DGE between the second and third cell separation patterns DB2 and DB3. There may be a dummy region between the first cell separation pattern DB1 and the first fin cut trench FCT1. The second region II may have a width of 2CPP. A second region II may be defined by the third and fourth cell separation patterns DB3 and DB4. A third region III may have a width of 3CPP. The third region III may be defined by the fourth and fifth cell separation patterns DB4 and DB5. A second fin cut trench FCT2 may cut the active pattern between the two dummy gate electrodes DGE between the fourth and fifth cell separation patterns DB4 and DB5. A fourth region IV may have a width of 2CPP. The fourth region IV may be defined by the fifth and sixth cell separation patterns DB5 and DB6. A fifth region V may have a width of 5CPP. The fifth region V may be separated by the sixth and eighth cell separation patterns DB6 and DB8. The third fin cut trench FCT3 may cut the active pattern between the two dummy gate electrodes DGE between the sixth and seventh cell separation patterns DB6 and DB7. There may be a dummy region between the first fin cut trench FCT1 and the eighth cell separation pattern DB8.

The well tap cell WTC may include a first contact via VA1 and a second contact via VA2. The first contact via VA1 may be placed in the fourth region IV, and the second contact via VA2 may be placed in the second region II.

The well tap cell WTC may apply a voltage to the well from the first and second power rails PR1 and PR2 through the first and second contact vias VA1 and VA2. The first contact via VA1 may connect the first power rail PR1 of the first metal layer and the first well contact on a first source/drain region to be described below. Therefore, the first voltage VDD may be provided to the first active pattern under the first source/drain region and the first well which is a substrate. The first well may be an n-well. The second contact via VA2 may connect the second power rail PR2 of the first metal layer and a second well contact on the second source/drain region to be described below. Therefore, the second voltage VSS may be provided to the second active pattern under the second source/drain region and the second well which is the substrate. The second well may be a p-well. The types of the first well and the second well may be reversed (e.g., the first well may be a p-well and the second well may be an n-well).

Figure 6:
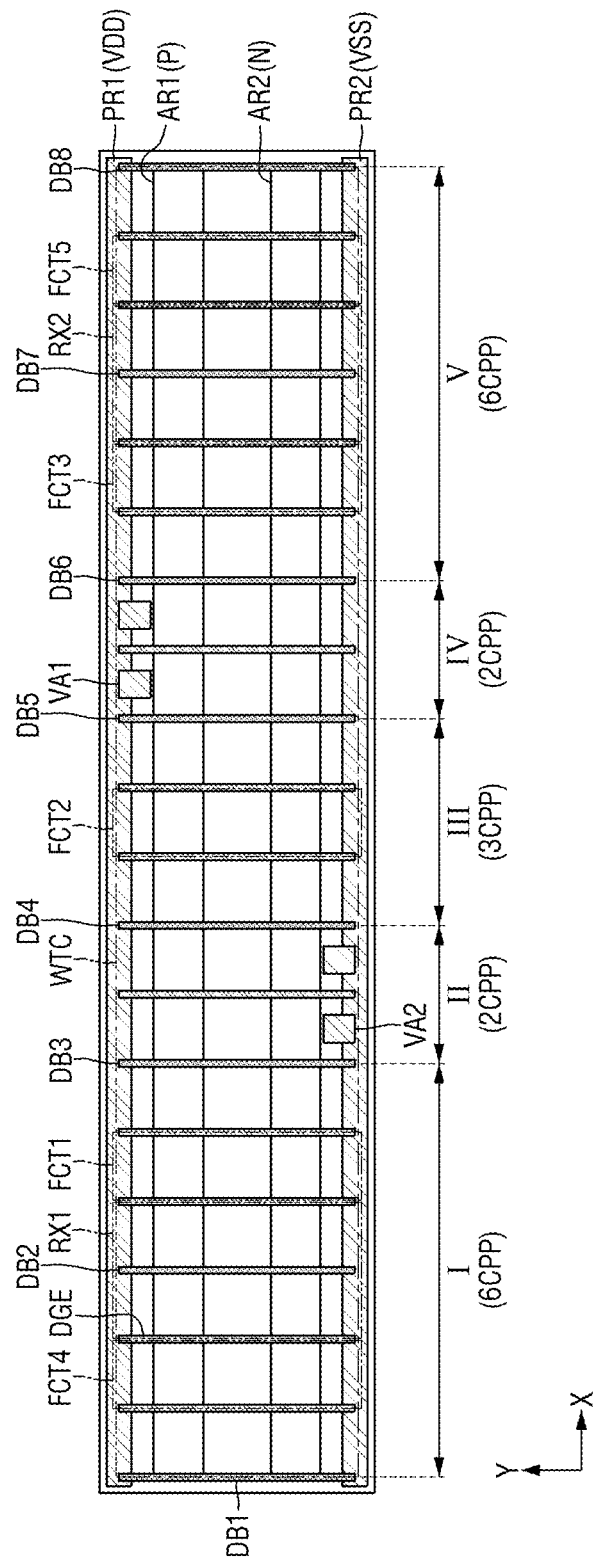

Next, referring to FIG. 6, a dummy gate electrode DGE may be further placed between the first cell separation pattern DB1 and the second cell separation pattern DB2 of the first region I, and between the seventh cell separation pattern DB7 and the eighth cell separation pattern DB8 of the fifth region V. That is, the first cell separation pattern DB1 and the second cell separation pattern DB2 may be separated by 3CPP, and the seventh cell separation pattern DB7 and the eighth cell separation pattern DB8 may be separated by 3CPP. The first region I and the fifth region V may have a width of 6CPP. The well tap cell WTC may have a width of 19CPP.

A fourth fin cut trench FCT4 that cuts the active pattern between the two dummy gate electrodes DGE between the first cell separation pattern DB1 and the second cell separation pattern DB2, and a fifth fin cut trench FCT5 that cuts the active pattern between the two dummy gate electrodes DGE between the seventh cell separation pattern DB7 and the eight cell separation pattern DB8 may be further formed.

A first cut structure RX1 that separates the first active region AR1 and the second active region AR2 may be further formed between the fourth fin cut trench FCT4 and the first fin cut trench FCT1. A second cut structure RX2 that separates the first active region AR1 and the second active region AR2 may be further formed between the third fin cut trench FCT3 and the fifth fin cut trench FCT5.

That is, referring to FIG. 7, the first and second active regions AR1 and AR2, and the first and second active patterns on the first and second active regions AR1 and AR2 may be removed, and the first and second cut structures RX1 and RX2 may be formed at that position. The first active region AR1 may be separated in the first direction X and the second active region AR2 may be separated in the first direction X by the first and second cut structures RX1 and RX2.

Next, referring to FIGS. 8 and 9, the second power tap cell may be placed on the first cut structure RX1, and the first power tap cell may be placed on the second cut structure RX2. The first and second well contacts WC1 and WC2 may be placed between the first power tap cell and the second power tap cell. The well tap cell WTC may be a single height cell. The well tap cell WTC may include two power through vias PTSV1 and PTSV2.

The first power tap cell may include a first expansion part EXP1 and a first power through via PTSV1. The first expansion part EXP1 may protrude from the first extension part E1 toward the second extension part E2. The first power through via PTSV1 may penetrate the second cut structure RX2 and the substrate 100 to connect the first expansion part EXP1 and the power delivery network PDN.

The second power tap cell may include a second expansion part EXP2 and a second power through via PTSV2. The second expansion part EXP2 may protrude from the second extension part E2 toward the first extension part E1. The second power through via EXP2 may penetrate the first cut structure RX1 and the substrate 100 to connect the second expansion part EXP2 and the power delivery network PDN.

The second expansion part EXP2 may protrude in a direction opposite to the first expansion part EXP1. The second expansion part EXP2 may protrude in the second direction Y, and the first expansion part EXP1 may protrude in the direction opposite to the second direction Y. For example, at least a part of the first expansion part EXP1 may overlap the second expansion part EXP2 in the first direction X. The first expansion part EXP1 may be placed on one side of the first active region AR1, and the second expansion part EXP2 may be placed on the other side of the second active region AR2. The first expansion part EXP1 may be placed on one side of the first active region AR1, and the second expansion part EXP2 may be placed on the other side of the second active region AR2 adjacent to the first active region AR1 in the second direction Y. The first expansion part EXP1 does not overlap the second expansion part EXP2 in the second direction Y.

The first well contact WC1 may be placed on the first source/drain region SD1. The first contact via VA1 may be placed on the first well contact WC1. The first contact via VA1 may be placed between the first power rail PR1 and the first well contact WC1. The first voltage VDD supplied from the power delivery network PDN to the first power rail PR1 through the first power through via PTSV1 may be provided from the first power rail PR1 to the first well through the first contact via VA1, the first well contact WC1 and the first source/drain region SD1.

The second well contact WC2 may be placed on the second source/drain region SD2. The second contact via VA2 may be placed on the second well contact WC2. The second contact via VA2 may be placed between the second power rail PR2 and the second well contact WC2. The second voltage VSS supplied from the power delivery network PDN to the second power rail PR2 through the second power through via PTSV2 may be provided from the second power rail PR2 to the second well through the second contact via VA2, the second well contact WC2 and the second source/drain region SD2.

The first and second well contact WC1 and WC2 may have the same structure as the source/drain contact CA. The first and second well contact WC1 and WC2 may include a source/drain barrier film 182 and a source/drain filling film 184.

The semiconductor device according to example embodiments may add 1CPP to each of the first dummy region between the first cell separation pattern DB1 and the first fin cut trench FCT1 of the well tap cell WTC, and the second dummy region between the third fin cut trench FCT3 and the eighth cell separation pattern DB8, and insert the first and second power tap cells into each of the first and second dummy regions. Therefore, the well tap cell WTC may function as not only a power tap cell that applies a voltage to the first and second power rails PR1 and PR2 from the power delivery network PND, but also a well tap cell that applies a voltage to the well from the first and second power rails PR1 and PR2. Therefore, the area occupied by the power tap cell and the well tap cell in the semiconductor device may decrease.

Figure 10:
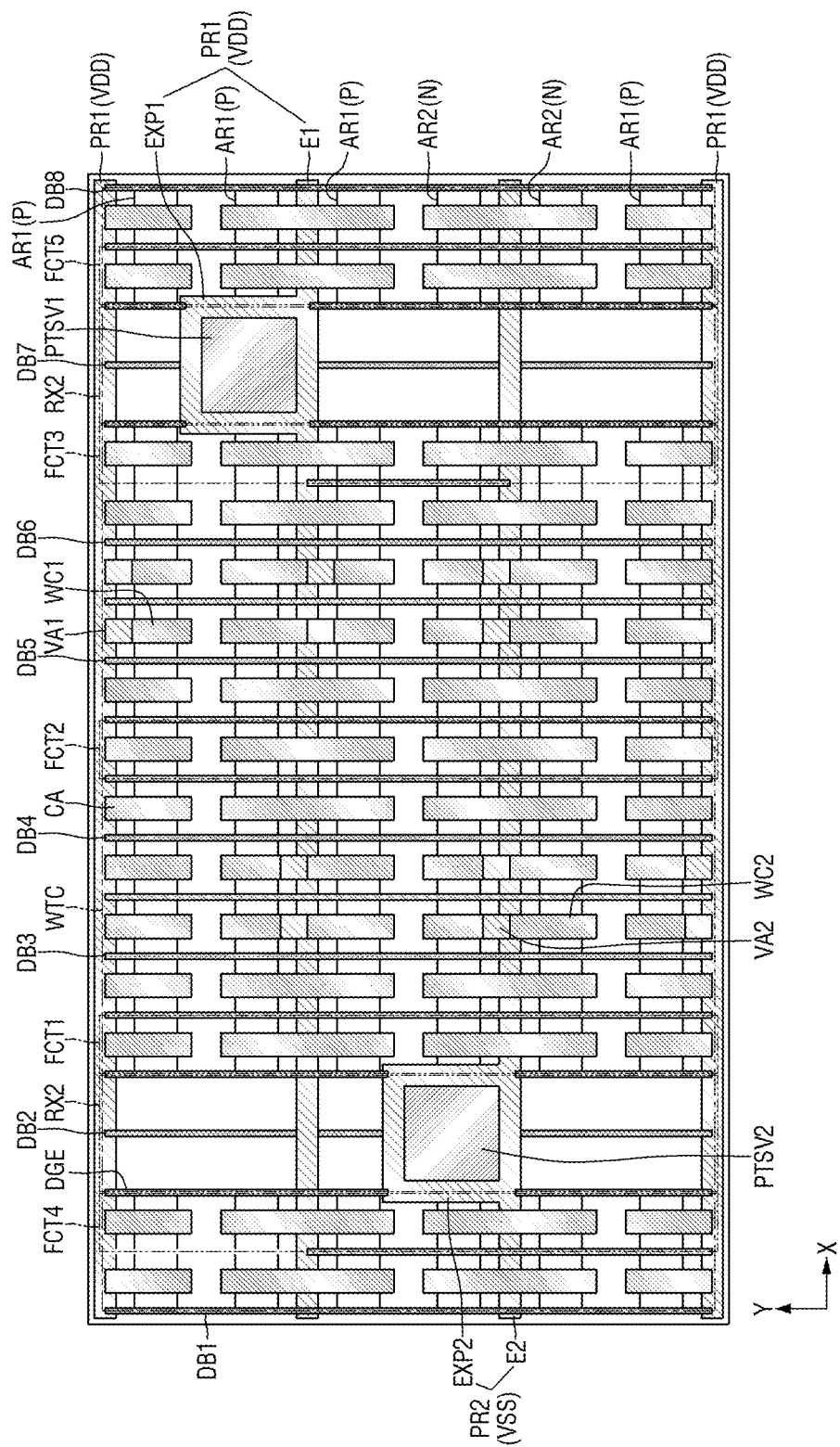

Referring to FIGS. 7 and 10, in the well tap cell WTC of the semiconductor device according to example embodiments, the first expansion part EXP1 and the first power through via PTSV1 may be placed on the second cut structure RX2, and the second expansion part EXP2 and the second power through via PTSV2 may be placed on the first cut structure RX1. The first expansion part EXP1 and the second expansion part EXP2 may not overlap in the first direction X and the second direction Y.

The first expansion part EXP1 and the second expansion part EXP2 may protrude in the same direction. The first expansion part EXP1 may protrude from the first extension part E1 in the third direction Z, and the second expansion part EXP2 may protrude from the second extension part E2 in the third direction Z.

Figure 11:
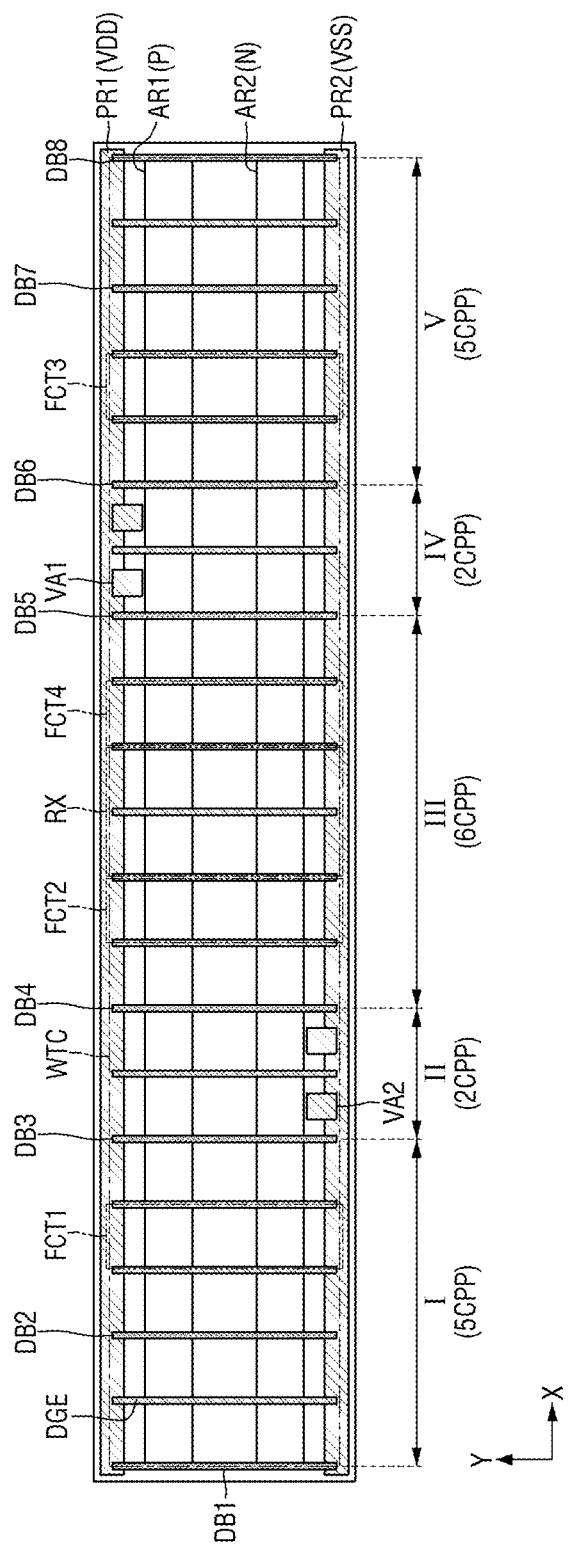

Referring to FIGS. 5 and 11, three dummy gate electrodes DGE may be further placed in the third region III. That is, the third region III may have a width of 6CPP. The well tap cell WTC may have a width of 20CPP.

The fourth fin cut trench FCT4 which cuts the active pattern between the two dummy gate electrodes DGe between the second fin cut trench FCT2 and the fifth cell separation pattern DB5, and the cut structure RX which separates the first active region AR1 and the second active region AR2 between the second fin cut trench FCT2 and the fourth fin cut trench FCT4 may be further formed. The second fin cut trench FCT2 and the fourth fin cut trench FCT4 may have a width of 1CPP, and the cut structure RX may have a width of 2CPP.

Figure 12:
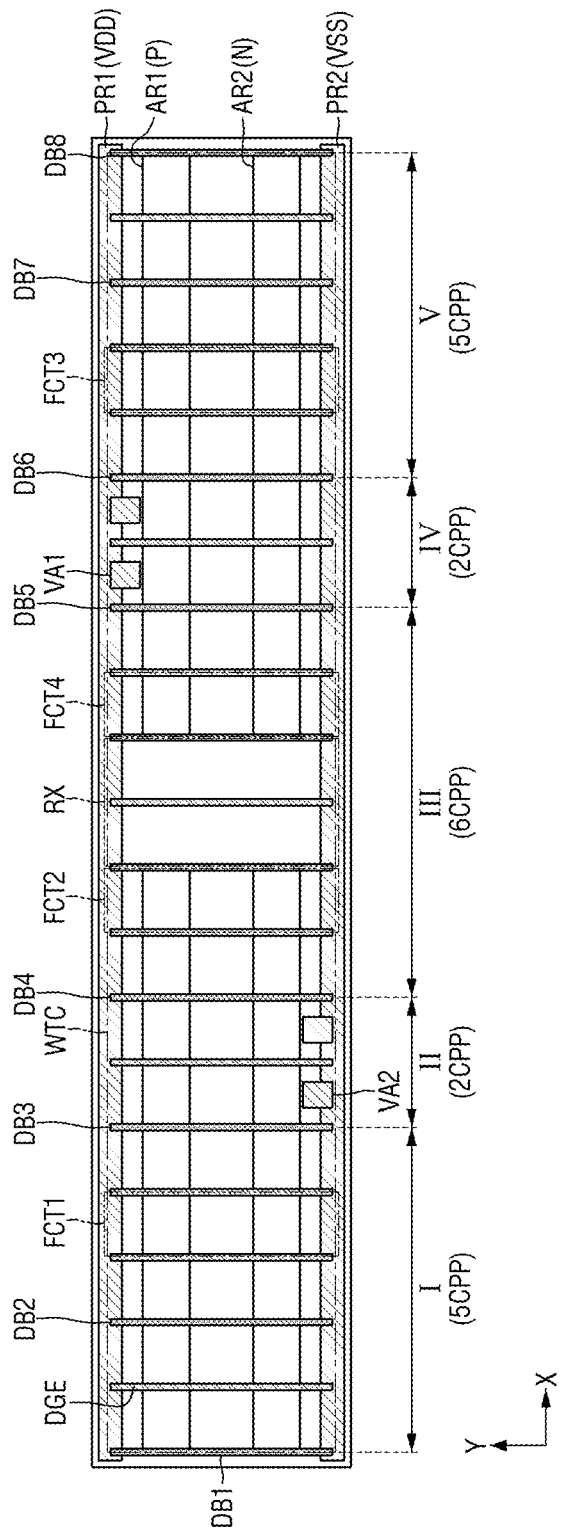

That is, referring to FIG. 12, the first and second active regions AR1 and AR2, and the first and second active patterns AP1 and AP2 on the first and second active regions AR1 and AR2 may be removed, and the cut structure RX may be formed at that position. The first active region AR1 may be separated in the first direction X, and the second active region AR2 may be separated in the first direction X by the cut structure RX.

Figure 13:
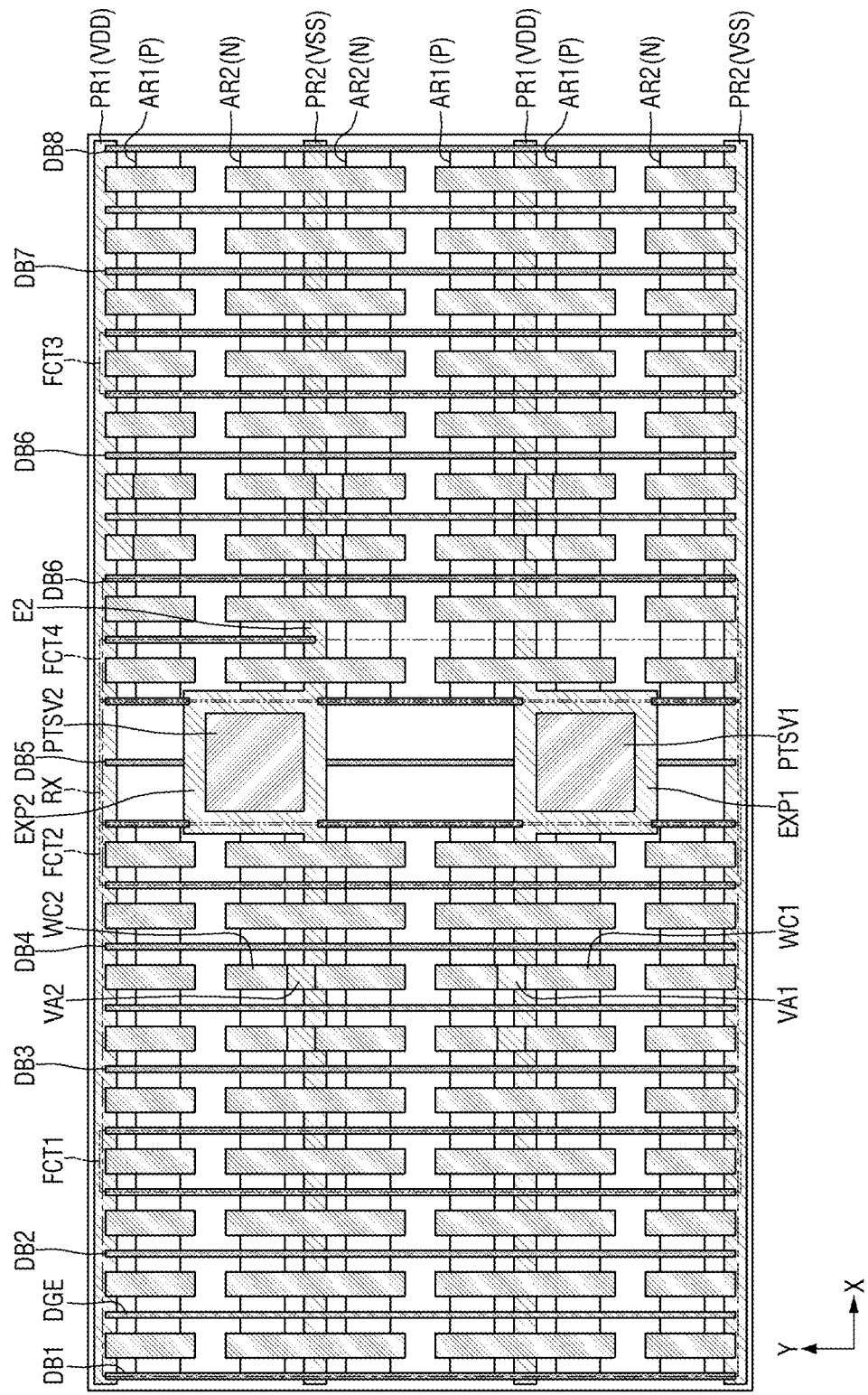

Next, referring to FIG. 13, the power tap cell PTC of FIG. 2 may be placed on the cut structure RX. A power tap cell PTC may be placed between the first contact via VA1 and the second contact via VA2. The well tap cell WTC may be a triple height cell. The well tap cell WTC may include two power through vias PTSV1 and PTSV2.

The semiconductor device according to example embodiments may add 3CPP to the third region III between the first contact via VA1 and the second contact via VA2 of the well tap cell WTC to insert the power tap cell. Therefore, the well tap cell WTC may function as not only a power tap cell that applies the voltage to the first and second power rails PR1 and PR2 from the power delivery network PND, but also a well tap cell that applies the voltage to the well from the first and second power rails PR1 and PR2. Therefore, the area occupied by the power tap cell and the well tap cell in the semiconductor device may decrease.

Figure 14:
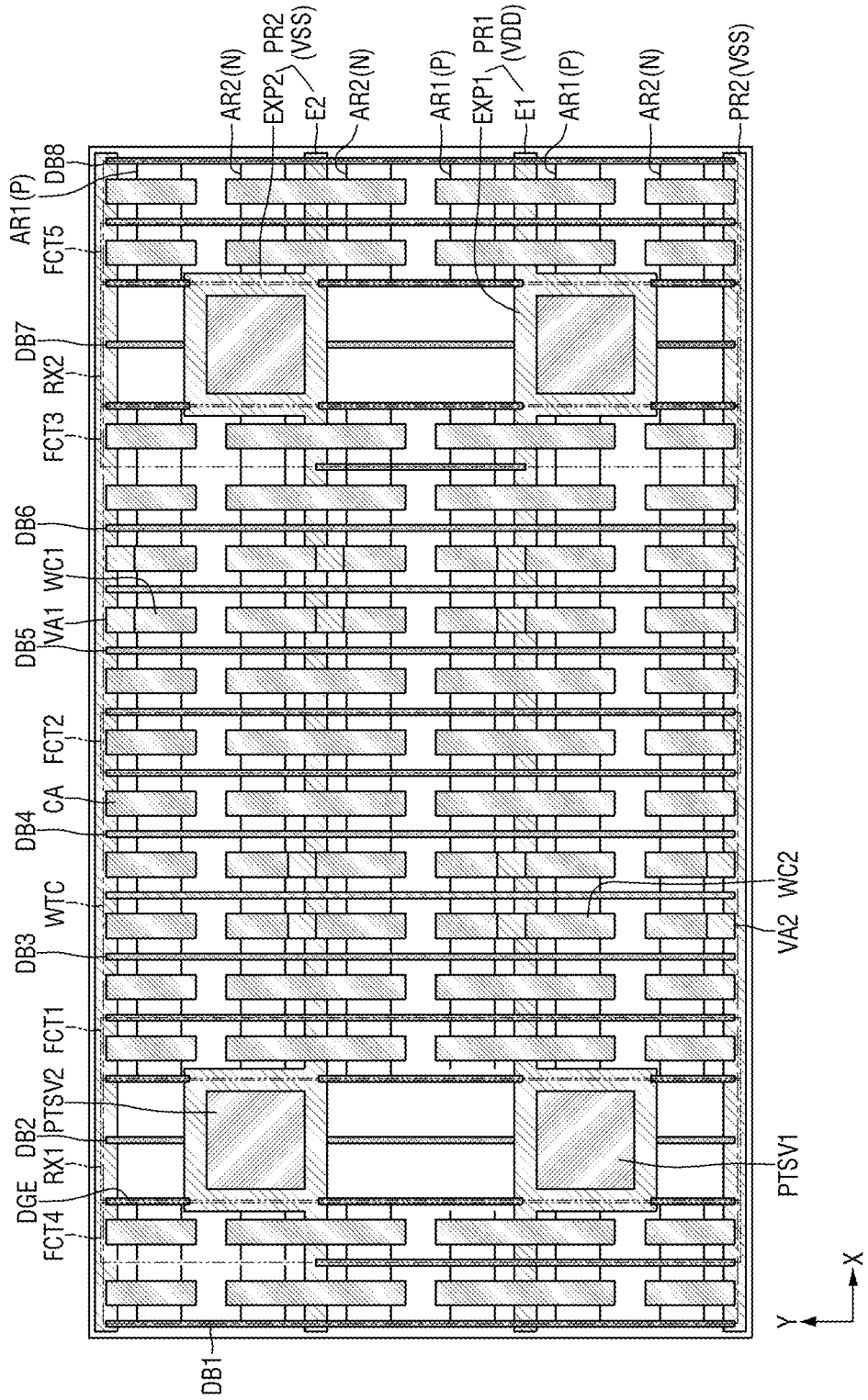

Referring to FIGS. 7 and 14, the power tap cell PTC of FIG. 2 may be placed on each of the first cut structure RX1 and the second cut structure RX2 of the well tap cell WTC according to example embodiments. The first power rail PR1 may include a first expansion part EXP1 on the first and second cut structures RX1 and RX2, and the second power rail PR2 may include a second expansion part EXP2 on the first and second cut structures RX1 and RX2. The first power through via PTSV1 may penetrate the first and second cut structures RX1 and RX2. The well tap cell WTC may be a triple height cell. The well tap cell WTC may include four power through vias PTSV1 and PTSV2.

Figure 15:
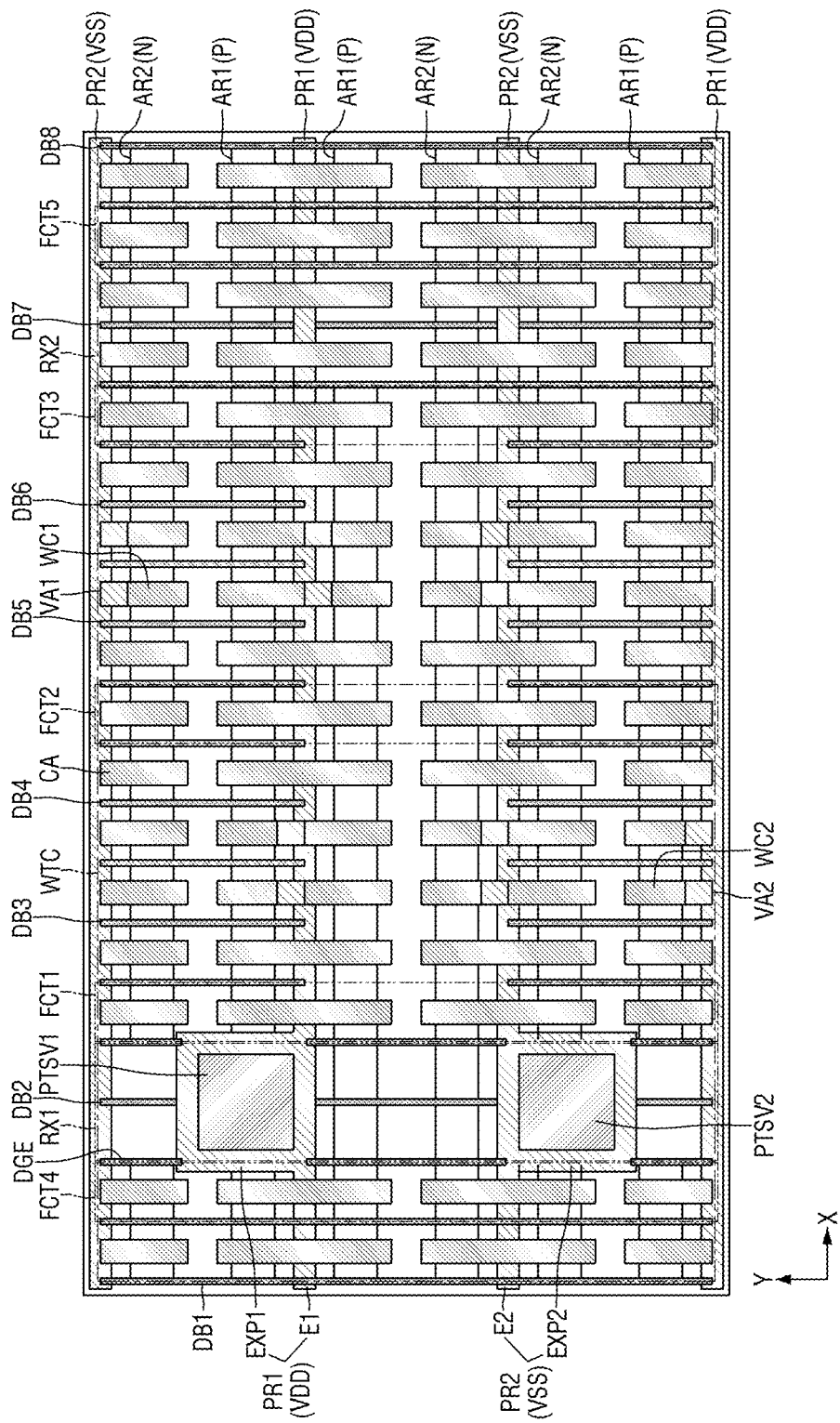

Referring to FIGS. 7 and 15, the power tap cell PTC of FIG. 2 may be placed in either the first cut structure RX1 or the second cut structure RX2 of the well tap cell WTC according to example embodiments. For example, the power tap cell may be placed on the first cut structure RX1. The well tap cell WTC may be a triple height cell. The well tap cell WTC may include two power through vias PTSV1 and PTSV2.

Figure 16:
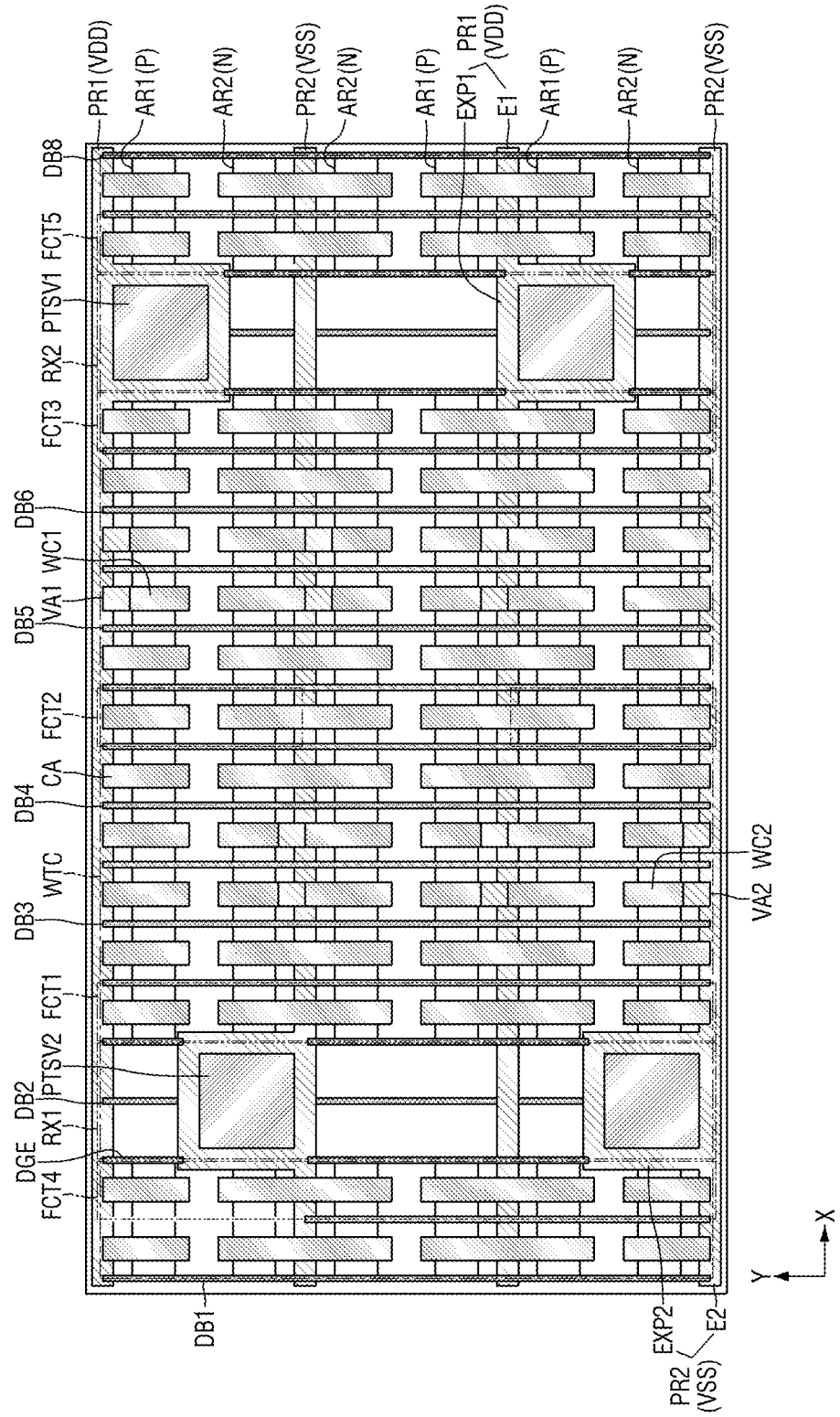

Referring to FIG. 16, the well tap cell WTC according to example embodiments may include two second expansion parts EXP2, and two second power through vias PTSV2 placed on the first cut structure RX1, and two first expansion parts EXP1 and two first power through vias PTSV1 placed on the second cut structure RX2. The first and second expansion parts EXP1 and EXP2 and the first and second power through vias PTSV1 and PTSV2 may be the same as the first and second expansion parts EXP1 and EXP2 and the first and second power through vias PTSV1 and PTSV2 of FIG. 8.

Figure 17:
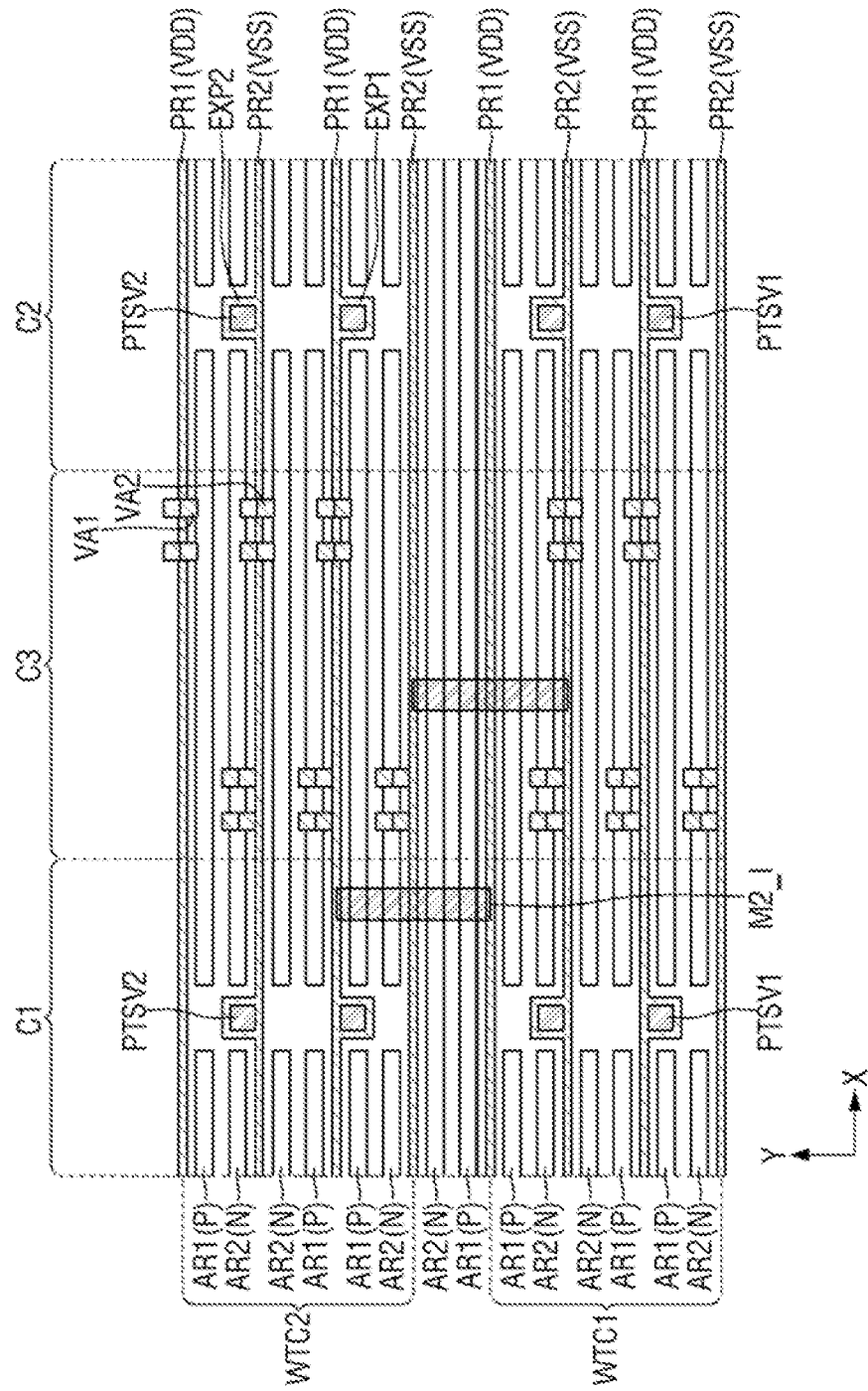
FIGS. 17, 18 and 19 are diagrams of a semiconductor device according to an example embodiment.
Figure 18:
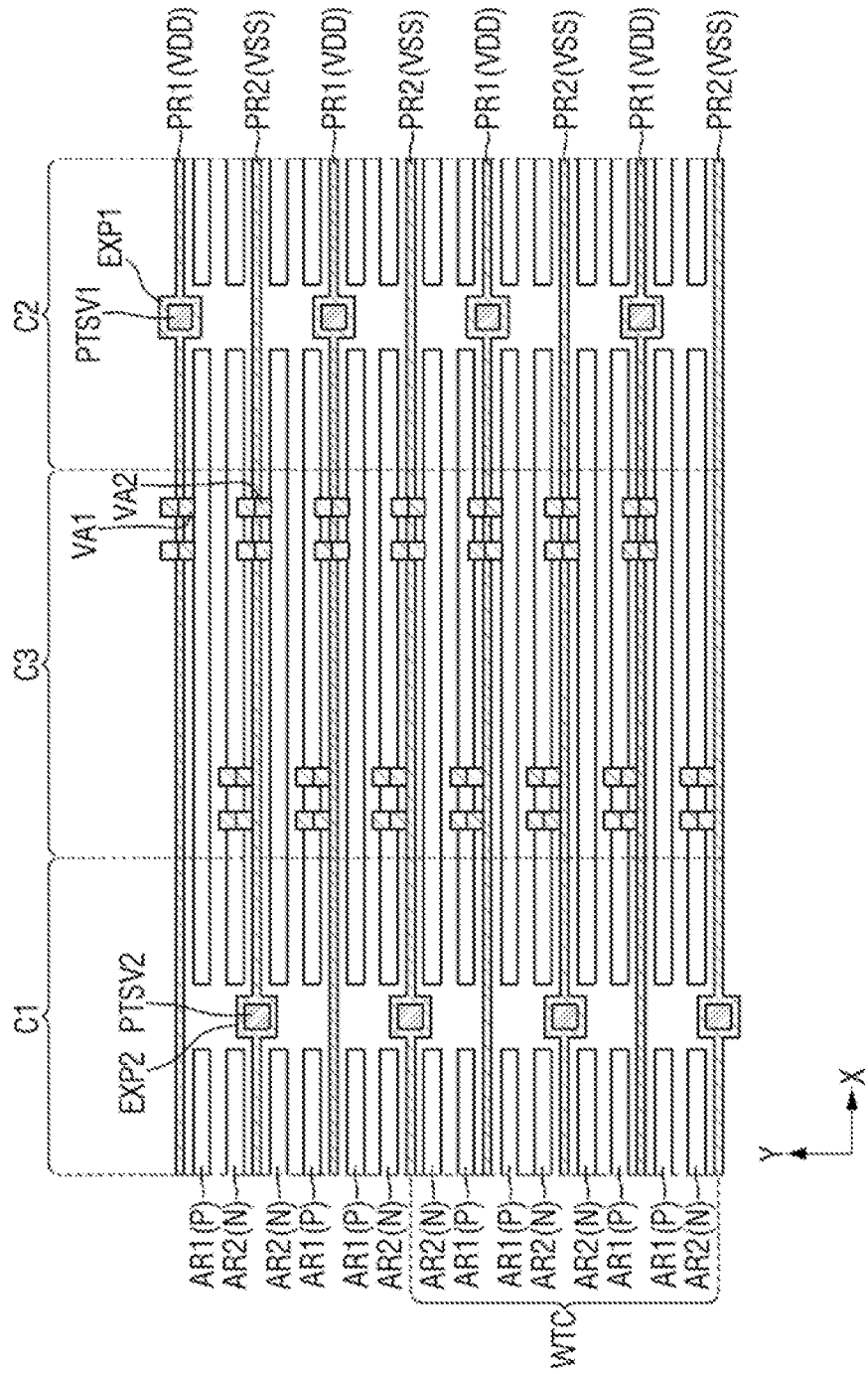
Figure 19:
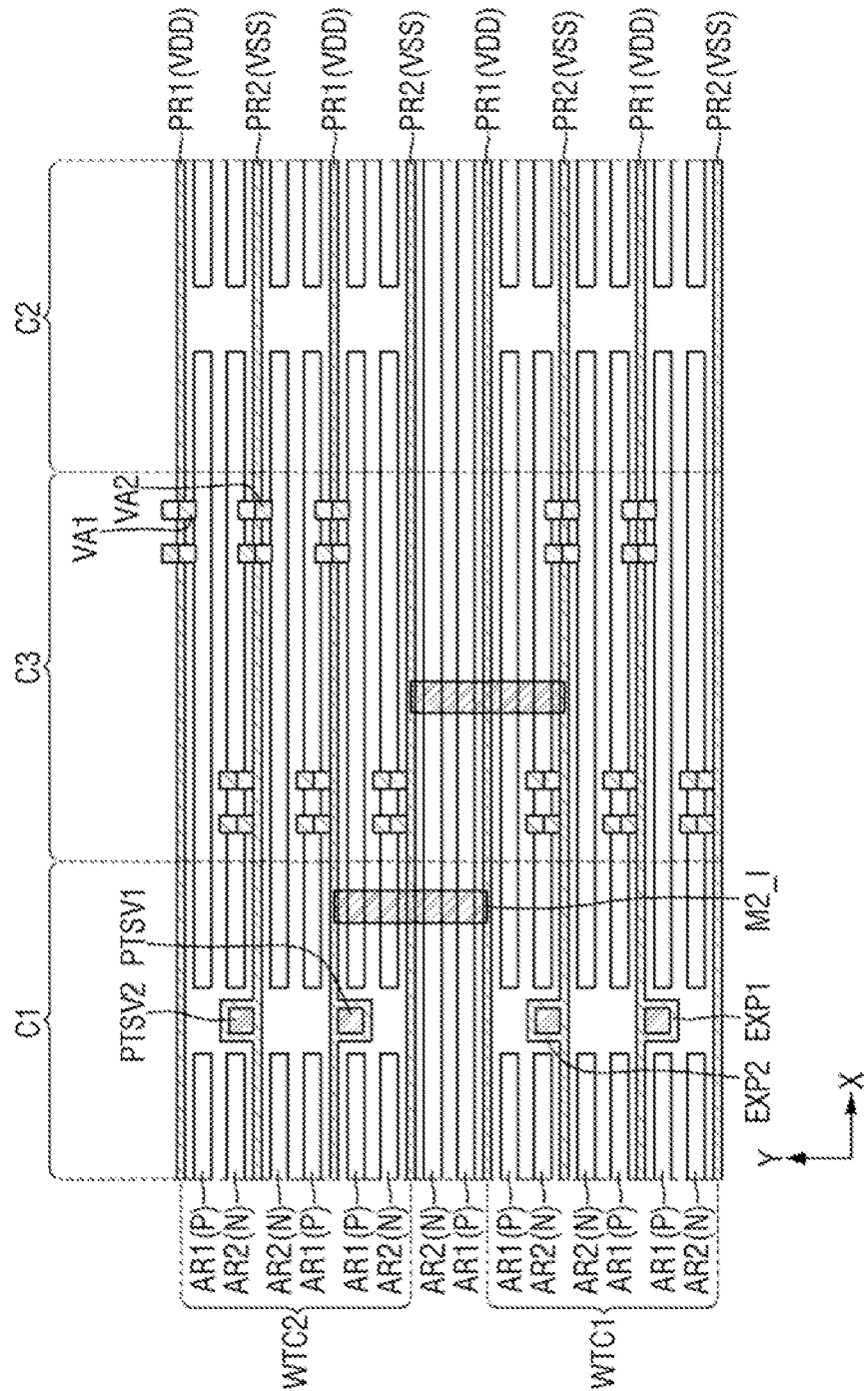

FIGS. 17, 18 and 19 are diagrams of a semiconductor device according to an example embodiment.

Referring to FIG. 17, the semiconductor device according to example embodiments may include a plurality of well tap cells, such as well tap cells WTC1 and WTC2, arranged in the second direction Y. Each of the well tap cells WTC1 and WTC2 may be the well tap cell WTC of FIG. 14.

Therefore, the first power through via PTSV1 and the second power through via PSTV2 may be configured in a first arrangement arranged along a first column C1 and a second column C2. The first and second contact vias VA1 and VA2 may be placed along a third column C3 between the first column C1 and the second column C2.

Each of the well tap cells WTC1 and WTC2 may be separated from each other in the second direction Y. The first well tap cell WTC1 and the second well tap cell WTC2 may be separated from each other in the second direction Y. The first power rail PR1 forming the boundary of the first well tap cell WTC1 and the second power rail PR2 forming the boundary of the second well tap cell WTC2 may be separated from each other in the second direction Y.

The first power rail PR1 forming the boundary of the first well tap cell WTC1 may be connected from the first power rail PR1 of the second well tap cell WTC2 through the second wiring M2_I of the second metal layer. The second power rail PR2 forming the boundary of the second well tap cell WTC2 may be connected from the second power rail PR2 of the first well tap cell WTC1 through the second wiring M2_I of the second metal layer.

Referring to FIG. 18, the semiconductor device according to example embodiments may include a plurality of well tap cells, such as well tap cell WTC, arranged in the second direction Y. Each well tap cell WTC may be the well tap cell WTC of FIG. 14.

Each well tap cell WTC may be adjacent to each other in the second direction Y. The two well tap cells WTC adjacent to each other may share the power through vias PTSV1 and PTSV2 connected to the expansion parts EXP1 and EXP2 of the power rails PR1 and PR2 at the boundary of the two well tap cells WTC adjacent to each other. The first power through via PTSV1 and the second power through via PTSV2 may be placed in zigzags.

The first expansion part EXP1 may protrude from both side walls of the first extension part E1 in the second direction Y, and the second expansion part EXP2 may protrude from both side walls of the second extension part E2 in the second direction Y. The first expansion part EXP1 may be placed, for example, at the center of the first extension part E1 in the second direction Y. The second expansion part EXP2 may be placed, for example, at the center of the second extension part E2 in the second direction Y. That is, the expansion parts EXP1 and EXP2 and the power through vias PTSV1 and PTSV2 of the well tap cells WTC adjacent to each other may be merged.

Therefore, the first power through via PTSV1 may be placed along the first column C1, and the second power through via PSTV2 may have a second arrangement placed along the second column C2. The first and second contact vias VA1 and VA2 may be placed along the third column C3 between the first column C1 and the second column C2.

Referring to FIG. 19, the semiconductor device according to example embodiments may include a plurality of well tap cells, such as well tap cells WTC1 and WTC2, arranged in the second direction Y. Each of the well tap cells WTC1 and WTC2 may be the well tap cell WTC of FIG. 15.

Therefore, the first power through via PTSV1 and the second power through via PSTV2 may be configured in a first arrangement placed along the first column C1 and the second column C2. The first and second contact vias VA1 and VA2 may be placed along the third column C3 between the first column C1 and the second column C2.

Each well tap cell WTC may be separated in the second direction Y. The first well tap cell WTC1 and the second well tap cell WTC2 may be separated in the second direction Y. The first power rail PR1 forming the boundary of the first well tap cell WTC1 and the second power rail PR2 forming the boundary of the second well tap cell WTC2 may be separated from each other in the first direction Y. The first power rail PR1 forming the boundary of the first well tap cell WTC1 may be connected from the first power rail PR1 of the second well tap cell WTC2 through the second wiring M2_I of the second metal layer. The second power rail PR2 forming the boundary of the second well tap cell WTC2 may be connected from the second power rail PR2 of the first well tap cell WTC1 through the second wiring M2_I of the second metal layer.

Figure 20:
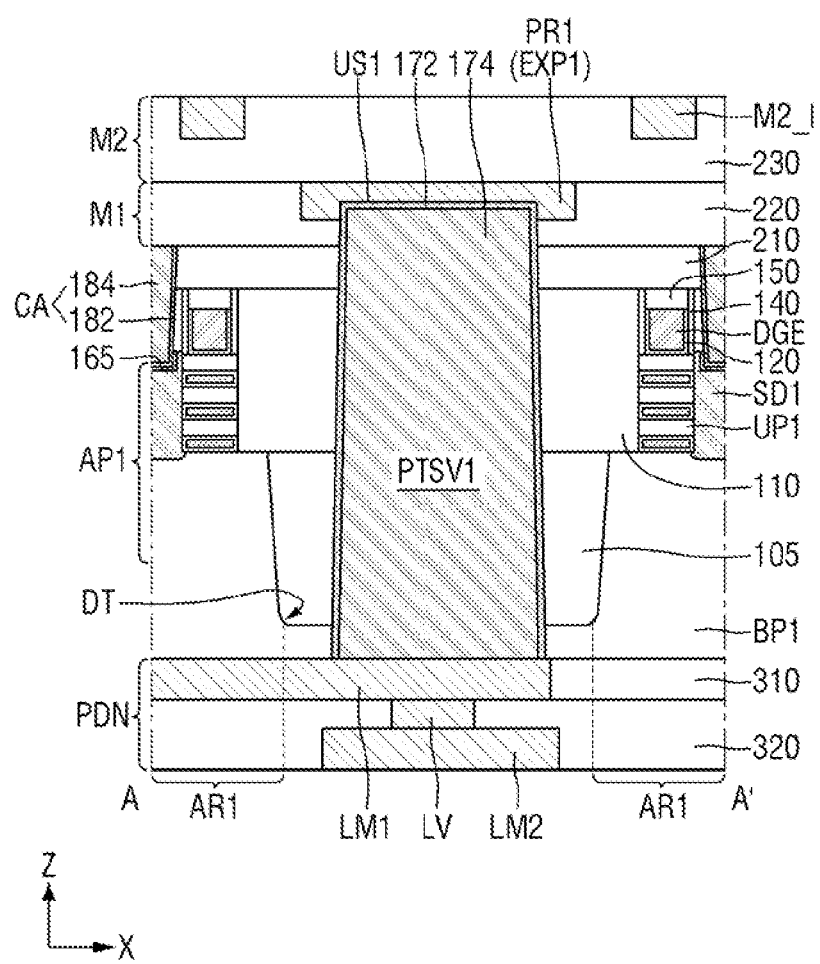
FIGS. 20 and 21 are diagrams of a semiconductor device according to an example embodiment.
Figure 21:
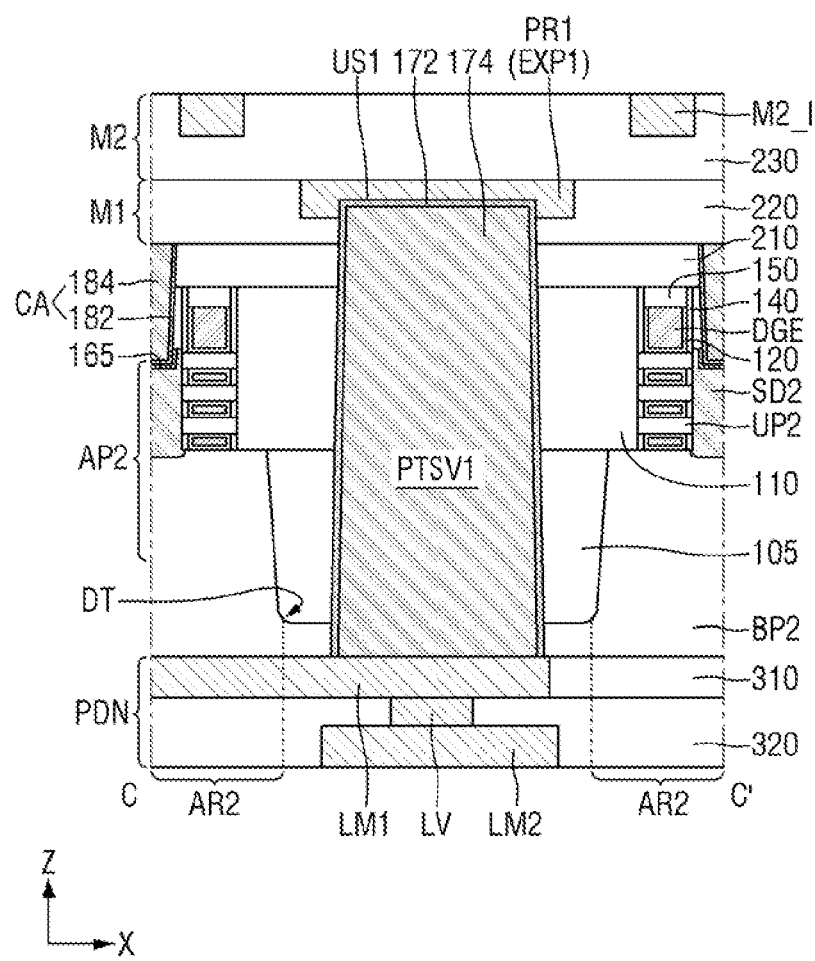

FIGS. 20 and 21 are diagrams of a semiconductor device according to an example embodiment. For reference, FIG. 20 is a cross-sectional view taken along A-A' of FIG. 2, and FIG. 21 is a cross-sectional view taken along C-C' of FIG. 2. For convenience of explanation, points different from those described using FIGS. 1 to 4 will be mainly described.

Referring to FIGS. 20 and 21, in the well tap cell WTC according to example embodiments, the first active pattern AP1 may include a first lower pattern BP1 and a plurality of first upper patterns UP1, and the second active pattern AP2 may include a second lower pattern BP2 and a plurality of second upper patterns UP2.

The first lower pattern BP1 and the second lower pattern BP2 may protrude from the first side 100a of the substrate 100. The plurality of first upper patterns UP1 may be separated from the first lower pattern BP1 in the third direction Z. The plurality of first upper patterns UP1 are sequentially stacked on the first lower pattern BP1 and may be separated from each other in the third direction Z. The plurality of second upper patterns UP2 are sequentially stacked on the second lower pattern BP2, and may be separated from the second lower pattern BP2 in the third direction Z. The plurality of second upper patterns UP2 may be separated from each other in the third direction Z.

The plurality of first upper patterns UP1 and the plurality of second upper patterns UP2 may penetrate the dummy gate electrode DGE. The dummy gate electrode DGE may surround the outer peripheral surfaces of the plurality of first upper patterns UP1 and the plurality of second upper patterns UP2. The gate dielectric film 120 may be placed between the plurality of first and second upper patterns UP1 and UP2 and the dummy gate electrode DGE. The gate dielectric film 120 may surround the outer peripheral surfaces of the plurality of first upper patterns UP1 and the plurality of second upper patterns UP2.

Referring to FIG. 20, the gate spacer 140 may be placed between the first upper pattern UP1 placed at the uppermost part among the plurality of first upper patterns UP1 and the first source/drain region SD1. The gate spacer 140 may not be placed on the first upper pattern UP1 except for the first upper pattern UP1 placed at the uppermost part among the plurality of first upper patterns UP1. That is, the inner spacer is omitted and only the outer spacer may exist on the first upper pattern UP1.

Referring to FIG. 21, the gate spacer 140 may be placed between the plurality of second upper patterns UP2 and the second source/drain region SD2. The gate spacer 140 on the second upper pattern UP2 placed at the uppermost part among the plurality of second upper patterns UP2 may be an outer spacer, and the gate spacer 140 on the second upper pattern UP2 except for the second upper pattern UP2 placed at the uppermost part among the plurality of second upper patterns UP2 may be an inner spacer. The structure of the inner spacer may be the same as or different from that of the outer spacer.

Although the cross sections of the plurality of first upper patterns UP1 and the plurality of second upper patterns UP2 are shown to be a rectangle in the drawing, example embodiments are not limited thereto. For example, the cross sections of each of the plurality of first upper patterns UP1 and the plurality of second upper patterns UP2 may be different polygons or circles. In example embodiments, the widths of the plurality of first upper patterns UP1 and the plurality of second upper patterns UP2 may decrease as they go away from the first side 100a of the substrate 100.

Although three each of the plurality of first upper patterns UP1 and the plurality of second upper patterns UP2 are shown in the drawing, this is merely an example and the number of upper patterns UP1 and UP2 may vary accordingly.

Figure 22:
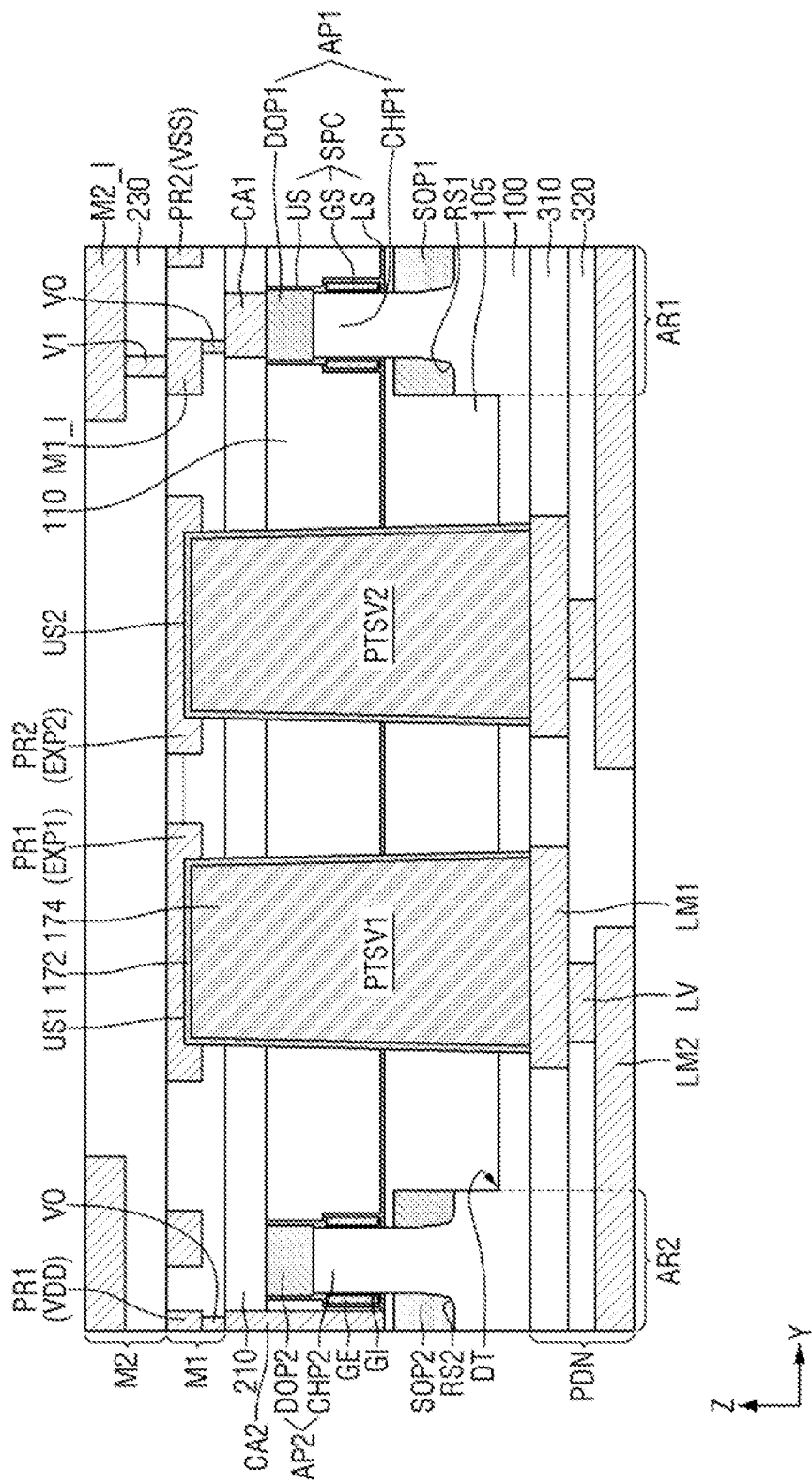
FIG. 22 is a diagram of a semiconductor device according to an example embodiment.

FIG. 22 is a diagram for explaining a semiconductor device according to example embodiments. For convenience of explanation, points different from those described using FIGS. 1 to 4 will be mainly described.

Referring to FIG. 22, the semiconductor device according to example embodiments may include vertical transistors (e.g., a vertical FET) and wirings that connect the vertical transistors to each other.

A first lower epi-pattern SOP1 may be provided on the first active region AR1, and a second lower epi-pattern SOP2 may be provided on the second active region AR2. From a planar point of view, the first lower epi-pattern SOP1 may overlap the first active region AR1, and the second lower epi-pattern SOP2 may overlap the second active region AR2. The first and second lower epitaxial patterns SOP1 and SOP2 may be epitaxial patterns formed by a selective epitaxial growth process. The first lower epi-pattern SOP1 may be provided inside a first recess region RS1 of the substrate 100, and the second lower epi-pattern SOP2 may be provided inside a second recess region RS2 of the substrate 100.

Each first active pattern AP1 may include a first channel pattern CHP1 protruding vertically from the first lower epi-pattern SOP1, and a first upper epi-pattern DOP1 on the first channel pattern CHP1. Each second active pattern AP2 may include a second channel pattern CHP2 protruding vertically from the second lower epi-pattern SOP2, and a second upper epi-pattern DOP2 on the second channel pattern CHP2.

The element separation film 105 may be provided on the substrate 100 to fill the substrate trench DT. The element separation film 105 may cover the upper surfaces of the first and second lower epi-patterns SOP1 and SOP2. The first and second active patterns AP1 and AP2 may protrude vertically above the element separation film 105.

A gate electrode GE may be provided on the element separation film 105. The gate electrode GE may wrap the first channel pattern CHP1 of the first active pattern AP1, and may wrap the second channel pattern CHP2 of the second active pattern AP2. A gate dielectric pattern GI may be interposed between the gate electrode GE and each of the first and second channel patterns CHP1 and CHP2. The gate dielectric pattern GI may cover the bottom surface of the gate electrode GE and the inner wall of the gate electrode GE. For example, the gate dielectric pattern GI may directly cover the side walls of the first and second active patterns AP1 and AP2.

The first and second upper epi-patterns DOP1 and DOP2 may protrude vertically above the gate electrode GE. The upper surface of the gate electrode GE may be lower than the bottom surfaces of each of the first and second upper epi-patterns DOP1 and DOP2. In other words, each of the first and second active patterns AP1 and AP2 may have a structure that protrudes vertically from the substrate 100 and penetrates the gate electrode GE.

The semiconductor element according to example embodiments may include vertical transistors in which carriers move in the third direction Z. For example, when a voltage is applied to the gate electrode GE and the transistor "turns on", carriers may move from the lower epi-patterns SOP1 and SOP2 to the upper epi-patterns DOP1 and DOP2 through the channel patterns CHP1 and CHP2. The gate electrode GE according to the present embodiment may completely surround side walls SW1 to SW4 of the channel patterns CHP1 and CHP2. The transistor according to the present disclosure may be a three-dimensional field effect transistor (e.g., VFET) having a gate all-around structure. Since the gate surrounds the channel, the semiconductor element according to the disclosure may have excellent electrical properties.

A spacer SPC that covers the gate electrode GE and the first and second active patterns AP1 and AP2 may be provided on the element separation film 105. The spacer SPC may contain a silicon nitride film or a silicon oxynitride film. The spacer SPC may include a lower spacer LS, an upper spacer US, and a gate spacer GS between the lower and upper spacers LS and US.

The lower spacer LS may directly cover the upper surface of the element separation film 105. The lower spacer LS may separate the gate electrodes GE from the element separation film 105 in the third direction Z. The gate spacer GS may cover the upper surfaces and the outer walls of each of the gate electrodes GE. The upper spacer US may cover the first and second upper epi-patterns DOP1 and DOP2. However, the upper spacer US may not cover the upper surfaces of the first and second upper epi-patterns DOP1 and DOP2, and may expose the upper surfaces.

A first upper interlayer insulating film ILD1 may be provided on the spacer SPC. An upper surface of the first upper interlayer insulating film 110 may be substantially coplanar with the upper surfaces of the first and second upper epi-patterns DOP1 and DOP2. Second to fourth upper interlayer insulating films 210, 220, and 230 may be sequentially stacked on the first upper interlayer insulating film 110. The second upper interlayer insulating film 210 may cover the upper surfaces of the first and second upper epi-patterns DOP1 and DOP2.

At least one active contact (e.g., CA1 and CA2) that penetrates the second upper interlayer insulating film 210 and is connected to the first and second upper epi-patterns DOP1 and DOP2 may be provided. At least one active contact (e.g., CA1 and CA2) which sequentially penetrates the second upper interlayer insulating film 210, the first upper interlayer insulating film 110, the lower spacer LS, and the element separation film 105 and is connected to the first and second upper epi-patterns DOP1 and DOP2 may be provided. A via V0 may be placed between the active contacts CA1 and CA2 and the first wiring M1_I. A gate contact that sequentially penetrates the second upper interlayer insulating film 210, the first upper interlayer insulating film 110, and the gate spacer GS and is connected to the gate electrode GE may be provided. The upper surfaces of the active contacts CA1 and CA2 and the gate contact may be substantially coplanar with the upper surface of the second upper interlayer insulating film 210. The first metal layer M1 may be provided inside the third upper interlayer insulating film 220. The second metal layer M2 may be provided inside the fourth upper interlayer insulating film 230.

A power delivery network PDN may be provided on the lower side of the substrate 100. The power delivery network PDN and the first expansion part EXP1 of the first power rail PR1 may be connected through the first power through via PTSV1. The power delivery network PDN and the second expansion part EXP2 of the second power rail PR2 may be connected through the second power through via PTSV2.

Although the semiconductor device according to example embodiments is shown to include a vertical transistor, this is only exemplary. For example, the semiconductor device according to example embodiments may include a tunneling transistor (e.g., a tunneling FET), complementary FET (CFET), a three-dimensional (3D) transistor, a bipolar junction transistor, a laterally diffused metal oxide semiconductor (LDMOS), and the like.

Figure 23:
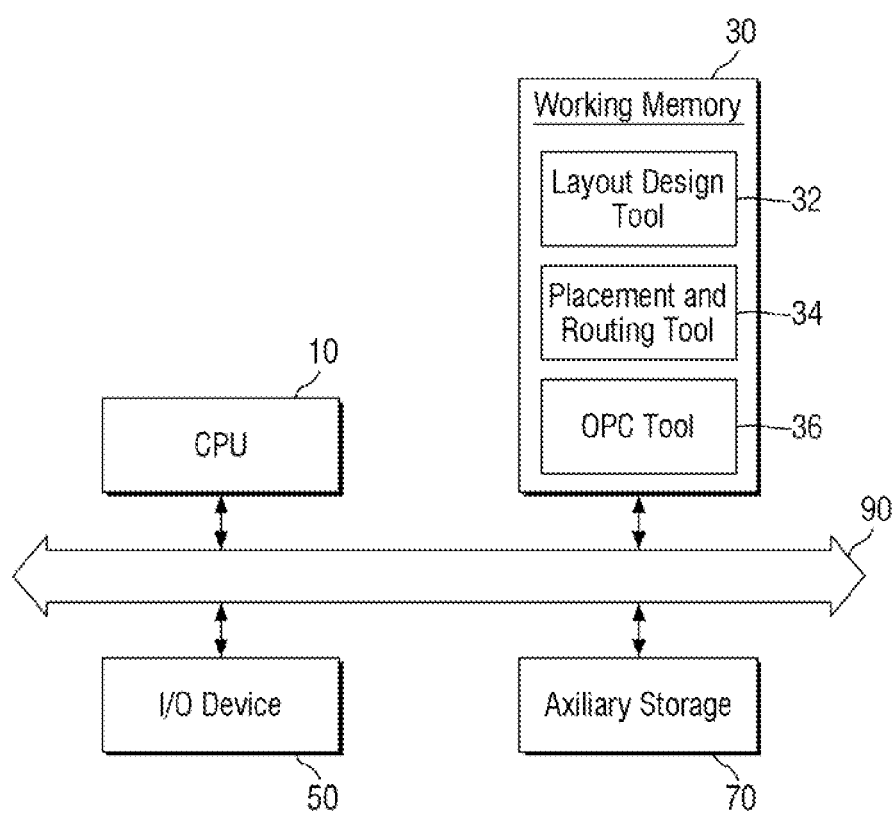
FIG. 23 is a block diagram of a computer system for performing a layout design of the semiconductor device according to an example embodiment.

FIG. 23 is a block diagram of a computer system for performing a layout design of the semiconductor device according to an example embodiment.

Referring to FIG. 23, the computer system may include a central processing unit (CPU) 10, a working memory 30, an input/output (I/O) device 50, and an auxiliary storage 70. The computer system may be provided as a dedicated device for the layout design of the semiconductor device according to example embodiments. In example embodiments, the computer system may include various design and verification simulation programs.

The CPU 10 may execute software (e.g., application program, operating system, and device drivers) to be executed by the computer system. The CPU 10 may execute an operating system loaded into the working memory 30. The CPU 10 may execute various application programs to be driven on the basis of the operating system. For example, the CPU 10 may execute a layout design tool 32, a placement and routing tool 34 and/or an OPC tool 36 loaded into the working memory 30.

The aforementioned operating system or application programs may be loaded into the working memory 30. The operating system image stored in the auxiliary storage 70 may be loaded into the working memory 30 on the basis of the booting sequence, when the computer system boots up. The operating system may support various I/O operations of the computer system.

The layout design tool 32 for layout design of the semiconductor device according to example embodiments may be loaded from the auxiliary storage 70 into the working memory 30. Subsequently, the placement and routing tool 34 which places the designed standard cells, rearranges the internal wiring pattern in the placed standard cells, and routes the placed standard cells, may be loaded from the auxiliary storage 70 into the working memory 30. Subsequently, the OPC tool 36 that performs optical proximity correction (OPC) on the designed layout data may be loaded from the auxiliary storage 70 into the working memory 30.

The I/O device 50 may control the user input and output from the user interface devices. For example, the I/O device 50 may receive input of information from the user, by including a keyboard or a monitor. The user may receive input of information about semiconductor region or data paths that require adjusted operating properties, using the I/O device 50. In addition, the processing procedure, processing results and the like of the OPC tool 36 may be displayed through the I/O device 50.

The auxiliary storage 70 may be provided as a storage medium of the computer system. The auxiliary storage 70 may store application programs, an operating system image, and various data.

A system interconnector 90 may be a system bus for providing a network inside the computer system. The CPU 10, the working memory 30, the I/O device 50, and the auxiliary storage 70 may be electrically connected and data may be exchanged each other through the system interconnector 90.

Figure 24:
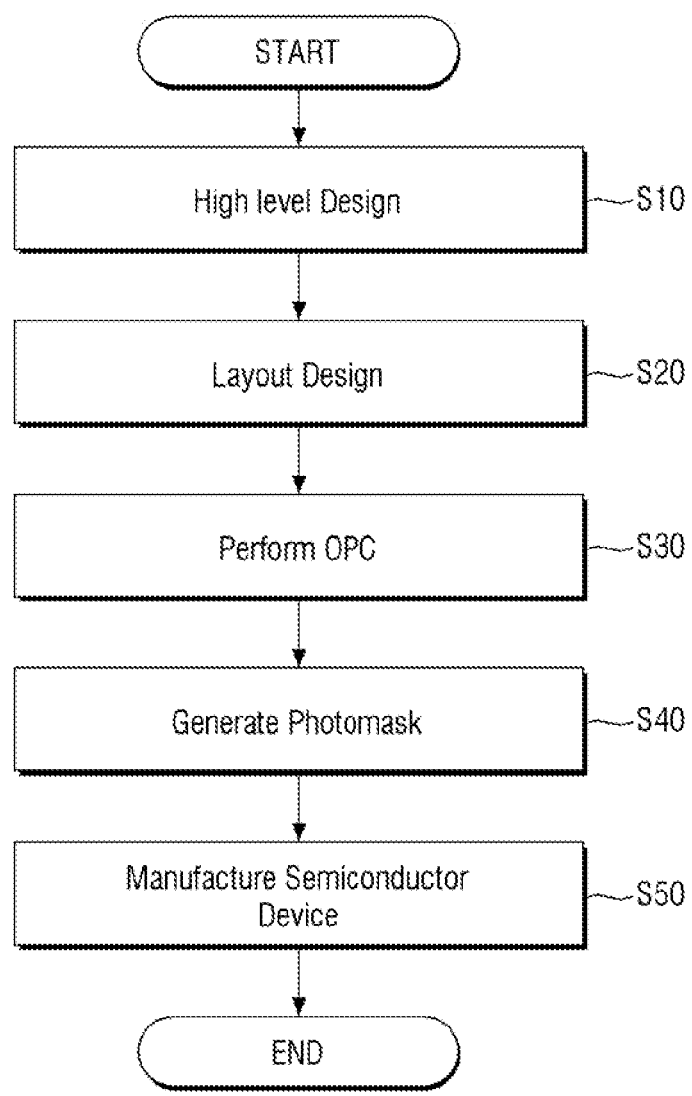
FIG. 24 is a flowchart of a layout design method and a fabricating method of the semiconductor device according to example embodiments

FIG. 24 is a flowchart of a layout design method and a fabricating method of the semiconductor device according to example embodiments.

Referring to FIG. 24, in operation S10, a high level design of a semiconductor integrated circuit may be performed, using the computer system described above using FIG. 23. The high level design may mean description of the integrated circuit to be designed in the parent language of a computer language. For example, a parent language such as C language may be used in the high level design. Circuits designed by the high level design may be expressed more specifically by register transfer level (RTL) coding or simulation. Subsequently, the code generated by the register transfer level coding is converted into Netlist and may be synthesized by the entire semiconductor elements. The synthesized schematic circuit is verified by the simulation tool, and the adjustment procedure may be accompanied according to the verification result.

In operation S20, a layout design for implementing the logically completed integrated circuit on a silicon substrate may be performed. For example, the layout design may be performed, by referring to the schematic circuit synthesized by the high level design or Netlist corresponding thereto. The layout design may include routing procedures for placing and connecting various standard cells provided by cell library in accordance with the defined design rules.

The layout may be a procedure which defines the form and size of a pattern for forming the transistor and the metal wirings to be actually formed on the silicon substrate. For example, in order to form an inverter circuit on the silicon substrate, a p-type FET (PFET), an n-type FET (NFET), a P-WELL, an N-WELL, a gate electrode, and layout patterns such as wiring patterns placed on them may be appropriately placed. Next, the selected and placed standard cells may be routed. Specifically, the upper wirings (routing patterns) may be placed on the placed standard cells. By performing the routing, the placed standard cells may be interconnected according to the design.

After routing, the layout may be verified whether there are any parts that violate the design rule. Items to be verified may include a design rule check (DRC), an electronical rule check (ERC), a layout vs. schematic (LVS), and the like.

In operation S30, an OPC procedure may be performed. The layout patterns provided through the layout design may be implemented on the silicon substrate, using a photolithography process. At this time, the optical proximity correction may be a technique for correcting a distortion phenomenon that may occur in the photolithography process.

In operation S40, a photomask may be manufactured on the basis of the layout changed by the optical proximity correction. The photomask may be manufactured, for example, in a manner of depicting the layout patterns, using a chrome film coated on the glass substrate.

In operation S50, a semiconductor element may be fabricated, using the generated photomask. In the fabricating process of the semiconductor element using a photomask, various types of exposure and etching processes may be repeated. Through such processes, the shape of the patterns formed at the time of layout design may be continuously formed on the silicon substrate.

In concluding the detailed description, those skilled in the art will appreciate that many variations and modifications may be made to the example embodiments without substantially departing from the principles of the disclosure. Therefore, the disclosed example embodiments of the disclosure are used in a generic and descriptive sense only and not for purposes of limitation.

What is claimed is:

1. A semiconductor device comprising:
   a substrate comprising a first side and a second side opposite to the first side;
   a first power rail and a second power rail provided on the first side of the substrate, the first power rail and the second power rail extending in a first direction and being separated in a second direction;
   a first active region and a second active region provided on the first side of the substrate, the first active region and the second active region being defined by an element separation film between the first power rail and the second power rail and being separated in the second direction;
   a power delivery network provided on the second side of the substrate;

a first power through via penetrating the element separation film and the substrate, the first power through via connecting the power delivery network and the first power rail;
a second power through via penetrating the element separation film and the substrate, the second power through via connecting the power delivery network and the second power rail;
a first well contact connecting the first active region and the first power rail; and
a second well contact connecting the second active region and the second power rail,
wherein the first power rail comprises:
a first extension part extending in the first direction, and
a first expansion part having a width larger than a width of the first extension part,
wherein the second power rail comprises:
a second extension part extending in the first direction, and
a second expansion part having a width larger than the width of the second extension part,
wherein the first power through via is connected to the first expansion part, and
wherein the second power through via is connected to the second expansion part.

2. The semiconductor device of claim 1, wherein the first expansion part is provided on a first side of the first active region, and
wherein the second expansion part is provided on a second side of the first active region.

3. The semiconductor device of claim 1, wherein the first well contact and the second well contact are provided between the first expansion part and the second expansion part.

4. The semiconductor device of claim 1, wherein the first expansion part protrudes toward the second extension part, and
wherein the second expansion part protrudes toward the first extension part.

5. The semiconductor device of claim 1, wherein the first expansion part protrudes from both side walls of the first extension part in the second direction, and
wherein the second expansion part protrudes from both side walls of the second extension part in the second direction.

6. The semiconductor device of claim 1, wherein the second expansion part protrudes in the second direction toward the first extension part, and
wherein the first expansion part protrudes in the second direction.

7. The semiconductor device of claim 1, wherein the second expansion part protrudes in the second direction,
wherein the first expansion part protrudes in a direction opposite to the second direction, and
wherein the second direction is opposite to a direction from the second extension part to the first extension part.

8. The semiconductor device of claim 7, wherein at least a part of the first expansion part overlaps the second expansion part in the second direction.

9. The semiconductor device of claim 7, wherein the first expansion part and the second expansion part are provided between the first well contact and the second well contact.

10. A semiconductor device comprising:
a substrate comprising a first side and a second side opposite to the first side;
a first power rail and a second power rail provided on the first side of the substrate, the first power rail and the second power rail extending in a first direction and being alternately arranged in a second direction;
a plurality of well tap cells provided on the first side of the substrate along the second direction; and
a power delivery network provided on the second side of the substrate,
wherein each of the plurality of well tap cells comprises:
a first power through via penetrating the substrate, the first power through via connecting the power delivery network and the first power rail,
a second power through via penetrating the substrate, the second power through via connecting the power delivery network and the second power rail,
a first well contact connecting a first active region and the first power rail, and
a second well contact connecting a second active region and the second power rail,
wherein the first power through via and the second power through via are configured in:
a first arrangement in which the first power through via and the second power through via are provided along a first column, or
a second arrangement in which the first power through via is provided along the first column and the second power through via is provided along a second column, and
wherein the first well contact and the second well contact are provided along a third column between the first column and the second column.

11. The semiconductor device of claim 10, wherein the plurality of well tap cells comprises a first well tap cell and a second well tap cell separated from each other in the second direction,
wherein the first power through via and the second power through via are configured in the first arrangement,
wherein a first voltage forming a first boundary of the first well tap cell is provided to the first well tap cell from the second well tap cell, and
wherein a second voltage forming a second boundary of the second well tap cell is provided to the second well tap cell from the first well tap cell.

12. The semiconductor device of claim 11, wherein each of the plurality of well tap cells further comprises:
a third power through via penetrating the substrate and connecting the power delivery network and the first power rail,
a fourth power through via penetrating the substrate and connecting the power delivery network and the second power rail, and
wherein the third power through via and the fourth power through via are provided along the second column.

13. The semiconductor device of claim 10, wherein the plurality of well tap cells comprises a first well tap cell and a second well tap cell adjacent to the first well tap cell in the second direction,
wherein the first well tap cell and the second well tap cell share a power through via connected to a power rail that defines a boundary between the first well tap cell and the second well tap cell,
wherein the first power through via and the second power through via are configured in the second arrangement, and
wherein the first power through via and the second power through via are provided in a zigzag arrangement.

14. A semiconductor device comprising:
a substrate comprising a first side and a second side opposite to the first side;
a first power rail and a second power rail provided on the first side of the substrate, the first power rail and the second power rail extending in a first direction and being alternately arranged in a second direction;
a well tap cell provided on the first side of the substrate in a first row, a second row adjacent to the first row, and a third row adjacent to the second row; and
a power delivery network provided on the second side of the substrate,
wherein each of the first row, the second row and the third tow is defined by the first power rail and the second power rail, and
wherein the well tap cell comprises:
  a first power through via penetrating the substrate and extending from the power delivery network to the first power rail,
  a first well contact connecting the first power rail and a first active region placed in each of the first row, the second row, and the third row,
  a second well contact connecting the second power rail and a second active region placed in each of the first row, the second row and the third row, and
  a second power through via penetrating the substrate and extending from the power delivery network to the second power rail.

15. The semiconductor device of claim 14, wherein the first power rail comprises:
a first extension part extending in the first direction, and
a first expansion part having a width larger than a width of the first extension part,
wherein the second power rail comprises:
a second extension part extending in the first direction, and
a second expansion part having a width larger than the width of the second extension part,
wherein the first power through via is connected to the first expansion part, and
wherein the second power through via is connected to the second expansion part.

16. The semiconductor device of claim 15, wherein the first expansion part protrudes from both side walls of the first extension part, and
wherein the second expansion part protrudes from both side walls of the second extension part.

17. The semiconductor device of claim 15, wherein the first expansion part protrudes from a first side wall of the first extension part,
wherein the second expansion part protrudes from a second side wall of the second extension part, and
wherein the first side wall and the second side wall are opposite to each other in the second direction.

18. The semiconductor device of claim 14, wherein the first power through via is provided in a first column,
wherein the second power through via is placed in a second column, and
wherein the first well contact and the second well contact are provided in a third column between the first column and the second column.

19. The semiconductor device of claim 14, wherein the first power through via and the second power through via are each provided in a first column and a second column, and
wherein the first well contact and the second well contact are provided in a third column between the first column and the second column.

20. The semiconductor device of claim 14, wherein the first power through via and the second power through via are provided in a first column, and
wherein the first well contact and the second well contact are provided in a second column.

* * * * *